(12) United States Patent
Higuchi et al.

(10) Patent No.: US 10,679,875 B2
(45) Date of Patent: Jun. 9, 2020

(54) SEALING MECHANISM COMPRISING AN ANNULAR SEALING MEMBER AND A LUBRICANT GROOVE STORING A LUBRICANT, A CONVEYANCE DEVICE, AND A MANUFACTURING DEVICE COMPRISING A SEALING MECHANISM

(71) Applicant: NSK LTD., Tokyo (JP)

(72) Inventors: Hideya Higuchi, Kanagawa (JP); Tsuyoshi Nakamura, Kanagawa (JP); Hideki Kon, Kanagawa (JP)

(73) Assignee: NSK LTD., Tokyo (JP)

( * ) Notice: Subject to any disclaimer, the term of this patent is extended or adjusted under 35 U.S.C. 154(b) by 763 days.

(21) Appl. No.: 15/100,406

(22) PCT Filed: Dec. 10, 2014

(86) PCT No.: PCT/JP2014/082743
§ 371 (c)(1),
(2) Date: May 31, 2016

(87) PCT Pub. No.: WO2015/087933
PCT Pub. Date: Jun. 18, 2015

(65) Prior Publication Data
US 2016/0300742 A1    Oct. 13, 2016

(30) Foreign Application Priority Data
Dec. 10, 2013   (JP) .................. 2013-255486

(51) Int. Cl.
*H01L 21/673*  (2006.01)
*H01L 21/67*   (2006.01)
*H01L 21/687*  (2006.01)

(52) U.S. Cl.
CPC .. *H01L 21/67126* (2013.01); *H01L 21/67376* (2013.01); *H01L 21/68792* (2013.01)

(58) Field of Classification Search
CPC ......... C30B 25/00; C30B 25/02; C30B 25/12; C30B 31/00; C30B 31/06; C30B 31/14;
(Continued)

(56) References Cited

U.S. PATENT DOCUMENTS

| 6,676,132 B1 | 1/2004 | Takebayashi et al. | |
| 2002/0047242 A1* | 4/2002 | Watanabe | F16J 15/006 277/553 |
| 2010/0013167 A1* | 1/2010 | Bachhofner | F16J 15/004 277/558 |

FOREIGN PATENT DOCUMENTS

| CN | 2656721 Y | 11/2004 |
| CN | 1327150 C | 7/2007 |

(Continued)

OTHER PUBLICATIONS

Communication dated Jun. 26, 2017, from the European Patent Office in counterpart European application No. 14870557.7.
(Continued)

*Primary Examiner* — Kenneth A Bratland, Jr.
(74) *Attorney, Agent, or Firm* — Sughrue Mion, PLLC

(57) ABSTRACT

A sealing mechanism functioning as a separator between two spaces having different pressures includes: a housing; a shaft inserted into the housing; an annular sealing member sealing a gap by contacting a radial outer surface of the shaft or a radial outer surface of a rotary portion fixed to the shaft; and a lubricant groove storing a lubricant to be supplied between the annular sealing member and the radial outer surface.

6 Claims, 21 Drawing Sheets

(58) Field of Classification Search
CPC .............. C23C 16/458; C23C 16/4582; C23C 16/4583–4584; H01L 21/67011; H01L 21/67126; H01L 21/6735; H01L 21/67376; H01L 21/68792
USPC ...... 117/84, 88, 98, 107, 200, 204; 118/715, 118/722, 724, 728–730, 733
See application file for complete search history.

(56) References Cited

FOREIGN PATENT DOCUMENTS

| | | |
|---|---|---|
| CN | 201225402 Y | 4/2009 |
| CN | 101432554 A | 5/2009 |
| CN | 201554859 U | 8/2010 |
| CN | 201912913 U | 8/2011 |
| CN | 202228679 U | 5/2012 |
| EP | 1201975 A2 | 5/2002 |
| JP | 2001-099326 A | 4/2001 |
| JP | 2002-228010 A | 8/2002 |
| JP | 2007-009939 A | 1/2007 |
| JP | 2013-204792 A | 10/2013 |

OTHER PUBLICATIONS

Communication dated Jan. 10, 2017 issued by the State Intellectual Property Office of People's Republic of China in corresponding application No. 201480064688.8.
International Search Report of PCT/JP2014/082743 dated Mar. 10, 2015 [PCT/ISA/210].

\* cited by examiner

SEALING MECHANISM COMPRISING AN ANNULAR SEALING MEMBER AND A LUBRICANT GROOVE STORING A LUBRICANT, A CONVEYANCE DEVICE, AND A MANUFACTURING DEVICE COMPRISING A SEALING MECHANISM

CROSS REFERENCE TO RELATED APPLICATIONS

This application is a National Stage of PCT international application Ser. No. PCT/JP2014/082743 filed on Dec. 10, 2014 which designates the United States, incorporated herein by reference, and which is based upon and claims the benefit of priority from Japanese Patent Application No. 2013-255486 filed on Dec. 10, 2013, the entire contents of which are incorporated herein by reference.

FIELD

The present invention relates to a sealing mechanism functioning as a separator between two spaces having different pressures, a drive unit of the sealing mechanism, a conveyance device, and a manufacturing device.

BACKGROUND

In a conveyance device and a manufacturing device such as a semiconductor manufacturing device or a machine tool, a sealing mechanism to rotate a rotary stage or rotate a semiconductor substrate, a workpiece, or a tool is used. As such a sealing mechanism, for example, a positioning device is disclosed in Patent Literature 1 (refer to FIG. 2).

CITATION LIST

Patent Literature

Patent Literature 1: Japanese Patent Application Laid-open Publication No. 2007-9939

SUMMARY

Technical Problem

According to the technology disclosed in Patent Literature 1, an O-ring that is a contact-type seal is housed inside a seal groove, thereby rotating a shaft while separating an external environment from the inside of a process chamber such as a vacuum chamber. Unfortunately, the O-ring or the shaft may be deformed or abraded because the O-ring is forcedly deformed to contact the shaft although the O-ring improves sealing performance. Since it takes time and labor to perform component replacement due to deformation or abrasion of the O-ring or the shaft, there is a demand to reduce frequency, and further, it is desired to provide a sealing mechanism in which the frequency of component replacement is reduced by suppressing time degradation of a component that improves sealing performance.

The present invention is achieved in view of the above-described situation, and has an objective to provide a sealing mechanism, a drive unit of the sealing mechanism, a conveyance device, and a manufacturing device, in which frequency of replacing a component that improves sealing performance is reduced.

Solution to Problem

To achieve the above objective, a sealing mechanism according to a first aspect functions as a separator between two spaces having different pressures and includes: a housing; a shaft inserted into the housing; an annular sealing member sealing a gap by contacting a radial outer surface of the shaft or a radial outer surface of a rotary portion fixed to the shaft; and a lubricant groove storing a lubricant to be supplied between the annular sealing member and the radial outer surface. By this, a state that the lubricant is present between the radial outer surface and the annular sealing member can be easily secured. Therefore, abrasion of the annular sealing member, shaft, or rotary portion is suppressed. Therefore, the sealing mechanism according to the present invention can reduce frequency of replacing a component that improves sealing performance.

As a desirable embodiment, preferably, the housing includes: a seal fixing spacer determining a size of the gap and further fixing the annular sealing member; and a lid portion fixing the seal fixing spacer, a radial inner side surface of the lid portion is located on a vertically higher side than a position of the annular sealing member, and the lubricant groove is provided at the radial inner side surface of the lid portion. By this, the lubricant is stably supplied between the annular sealing member and the radial outer surface from the lubricant groove by gravity.

As a desirable embodiment, preferably, the radial inner side surface of the lid portion is located closer than a position of the annular sealing member to a low pressure side of the two spaces having different pressures, the lubricant groove is provided at a part of the radial inner side surface of the lid portion, and a distance between the radial outer surface and a portion in the radial inner side surface of the lid portion, the portion in the radial inner side surface being located closer than the lubricant groove to the low pressure side of the two spaces having different pressures is smaller than a size of the gap. This makes the lubricant hardly pass through an area between the lid portion and the radial outer surface. Therefore, a situation that the lubricant is spattered on the internal space side is suppressed.

As a desirable embodiment, preferably, the housing includes: a seal fixing spacer determining a size of the gap and further fixing the annular sealing member; and a lid portion fixing the seal fixing spacer, a radial inner side surface of the seal fixing spacer is located on the vertically higher side than a position of the annular sealing member, and the lubricant groove is provided at the radial inner side surface of the seal fixing spacer. By this, even in the case where the lid portion is disposed on a vertically lower side than the annular sealing member, the lubricant Lu is stably supplied between the annular sealing member and the radial outer surface from the lubricant groove by gravity. Therefore, in the sealing mechanism, the frequency of replacing the component that improves sealing performance can be reduced even in the case where the lid portion is disposed on the vertically lower side than the annular sealing member.

As a desirable embodiment, preferably, the radial inner side surface of the seal fixing spacer is located closer than the position of the annular sealing member to a high pressure side of the two spaces having different pressures, the radial inner side surface of the lid portion is located closer than the position of the annular sealing member to the low pressure side of the two spaces having different pressures, and a distance between the radial inner side surface of the lid portion and the radial outer surface is smaller than the size of the gap. This makes the lubricant hardly pass through the area between the lid portion and the radial outer surface. Therefore, the situation that the lubricant is spattered on the internal space side is suppressed.

As a desirable embodiment, preferably, the shaft is supported in a rotatable manner. By this, the sealing mechanism can transmit rotary movement between the two spaces having different pressures or gases.

As a desirable embodiment, preferably, the shaft is supported in a linearly movable manner such that a relative position to the housing is axially changed. By this, the sealing mechanism can transmit linear movement between the two spaces having different pressures or gases.

A desirable embodiment is preferably a drive unit of a sealing mechanism including: the above-described sealing mechanism; and a drive unit applying at least one of rotary movement and linear movement to the shaft. With this structure, high sealing performance can be achieved in the drive unit of the sealing mechanism.

A desirable embodiment is preferably a conveyance device including: the above-described sealing mechanism; and a movable member moving a conveyance object, and movement of the movable member is linked with at least one of rotary movement and linear movement of the shaft. With this structure, high sealing performance can be achieved in the conveyance device.

A desirable embodiment is preferably a manufacturing device including the above-described sealing mechanism. With this structure, high sealing performance can be achieved in the manufacturing device, and product quality can be improved.

A sealing mechanism according to a second aspect is, preferably, a sealing mechanism functioning as a separator between the two spaces having different pressures, and includes: a housing; a shaft inserted into the housing; a plurality of annular sealing members sealing a gap at different positions by contacting a radial outer surface of the shaft or a radial outer surface of a rotary portion fixed to the shaft; and a lubricant groove storing a lubricant to be supplied between the annular sealing members and the radial outer surface, and at least one annular sealing member out of the plurality of annular sealing members is located closer than the lubricant groove to a low pressure side of the two spaces having different pressures.

As a desirable embodiment, preferably, the housing includes a seal fixing spacer determining a size of the gap and further fixing the annular sealing member, a radial inner side surface of the seal fixing spacer is located between the plurality of annular sealing members, and the lubricant groove is provided at the radial inner side surface of the seal fixing spacer.

As a desirable embodiment, preferably, the lubricant groove is provided at a part of the radial inner side surface of the seal fixing spacer, and a distance between the radial outer surface and a portion in the radial inner side surface of the seal fixing spacer is smaller than the size of the gap, the portion being located closer than the lubricant groove to the annular sealing member side.

As a desirable embodiment, preferably, the housing includes the seal fixing spacer determining the size of the gap and further fixing the annular sealing member, the radial inner side surface of the seal fixing spacer is located between the plurality of annular sealing members, and the lubricant groove is provided at a portion in the radial outer surface, the portion facing the radial inner side surface of the seal fixing spacer.

As a desirable embodiment, preferably, the lubricant groove is provided at a part of a portion in the radial outer surface, the portion facing the radial inner side surface of the seal fixing spacer. A distance between the radial inner side surface of the seal fixing spacer and a portion in the radial outer surface is preferably smaller than the size of the gap, the portion being located closer than the lubricant groove to the annular sealing member side.

A sealing mechanism according to a third aspect is, preferably, a sealing mechanism functioning as a separator between two spaces having different pressures, and includes: a housing; a shaft inserted into the housing; a fixing portion that contacts the housing; a lip portion that contacts a radial outer surface of the shaft or a radial outer surface of a rotary portion fixed to the shaft; and an annular connecting unit that connects the fixing portion to the lip portion, and further includes: an annular sealing member that seals a gap; and a biasing member that biases pressing force of the lip portion toward the radial outer surface side.

As a desirable embodiment, preferably, a space surrounded by the lip portion, the annular connecting unit, and the fixing portion is opened to a high pressure side of the two spaces having different pressures.

As a desirable embodiment, preferably, the biasing member is provided in the space surrounded by the lip portion, the annular connecting unit, and the fixing portion.

As a desirable embodiment, preferably, the housing includes: a housing body; a seal fixing spacer determining a size of the gap and further fixing the annular sealing member; a lid portion fixing the seal fixing spacer by being fixed to the housing body; and a second annular sealing member sealing a space formed by the housing body, the seal fixing spacer, and the lid portion, and the second annular sealing member has a diameter larger than the diameter of the above-mentioned annular sealing member.

As a desirable embodiment, preferably, the annular sealing member includes a seal flange portion on a radially outer side of the fixing portion, and the seal flange portion is fixed by the seal fixing spacer.

As a desirable embodiment, preferably, the annular sealing member is fixed by repellent force generated between the seal fixing spacer and the radial outer surface.

As a desirable embodiment, preferably, provided are: a bearing that is disposed at the housing and supports the shaft in a rotatable manner; and a rotary portion that is provided at one end portion of the shaft and is rotated together with the shaft. The annular sealing member is preferably located closer than the bearing to a low pressure side of the two spaces having different pressures.

As a desirable embodiment, preferably, the bearing includes: an outer ring; an inner ring disposed on a radially inner side of the outer ring; and a rolling element disposed between the outer ring and the inner ring, and the rotary portion is an inner ring holding member that fixes the inner ring.

Advantageous Effects of Invention

According to the present invention, it is possible to provide a sealing mechanism, a drive unit of the sealing mechanism, a conveyance device, and a manufacturing device, in which frequency of replacing a component that improves sealing performance is reduced.

DESCRIPTION OF EMBODIMENTS

In the following, modes to implement the present invention (hereinafter referred to as embodiments) will be described with reference to the drawings. Note that the present invention is not limited to the embodiments recited in the following. Further, components in the following embodiments include those readily conceivable by a man skilled in the art, those substantially identical therewith, and those within a so-called equivalent range. Moreover, the components disclosed in the following embodiments can be suitably combined.

First Embodiment

Figure 1:
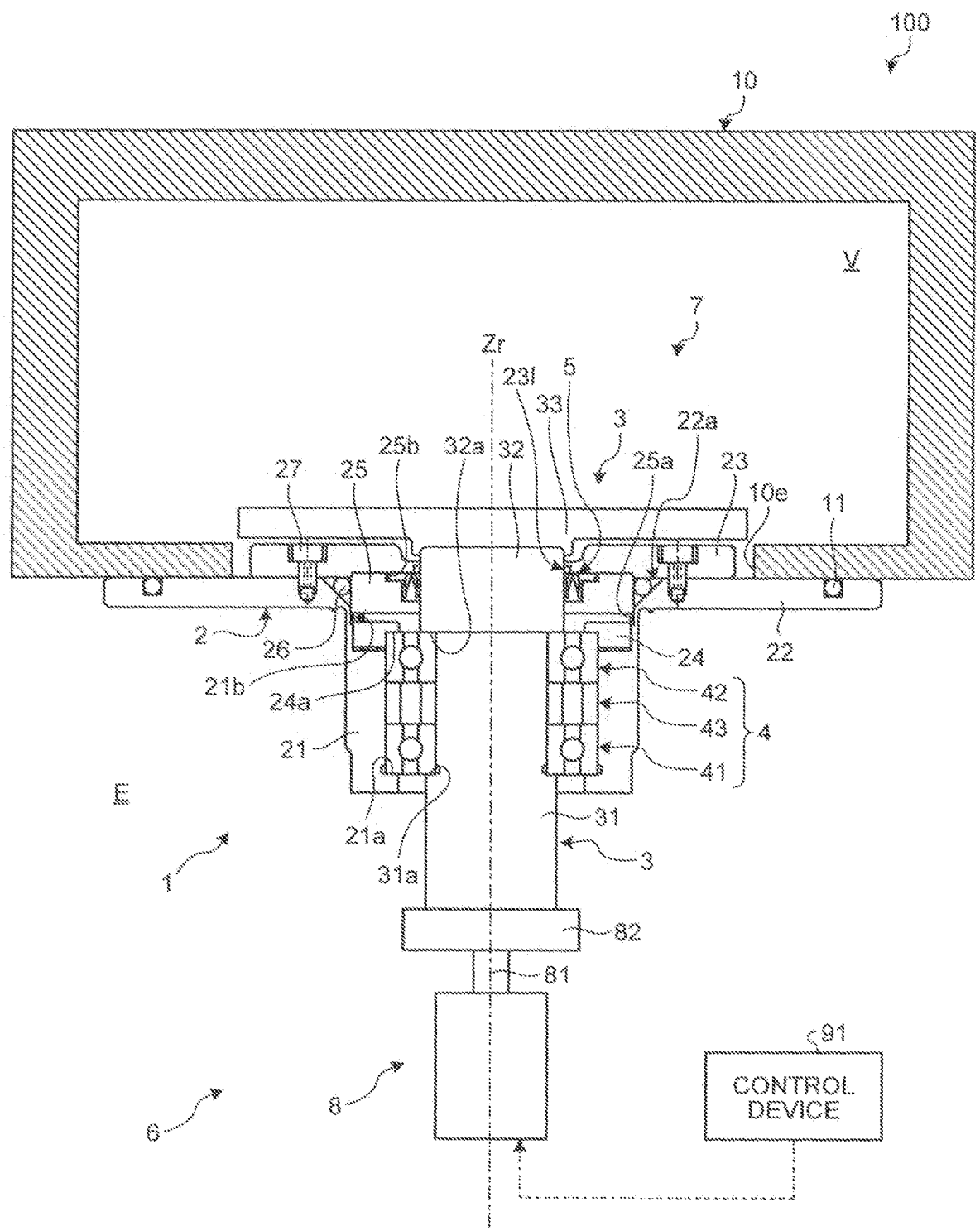
FIG. 1 is a cross-sectional view schematically illustrating a manufacturing device including a sealing mechanism according to a first embodiment.
Figure 2:
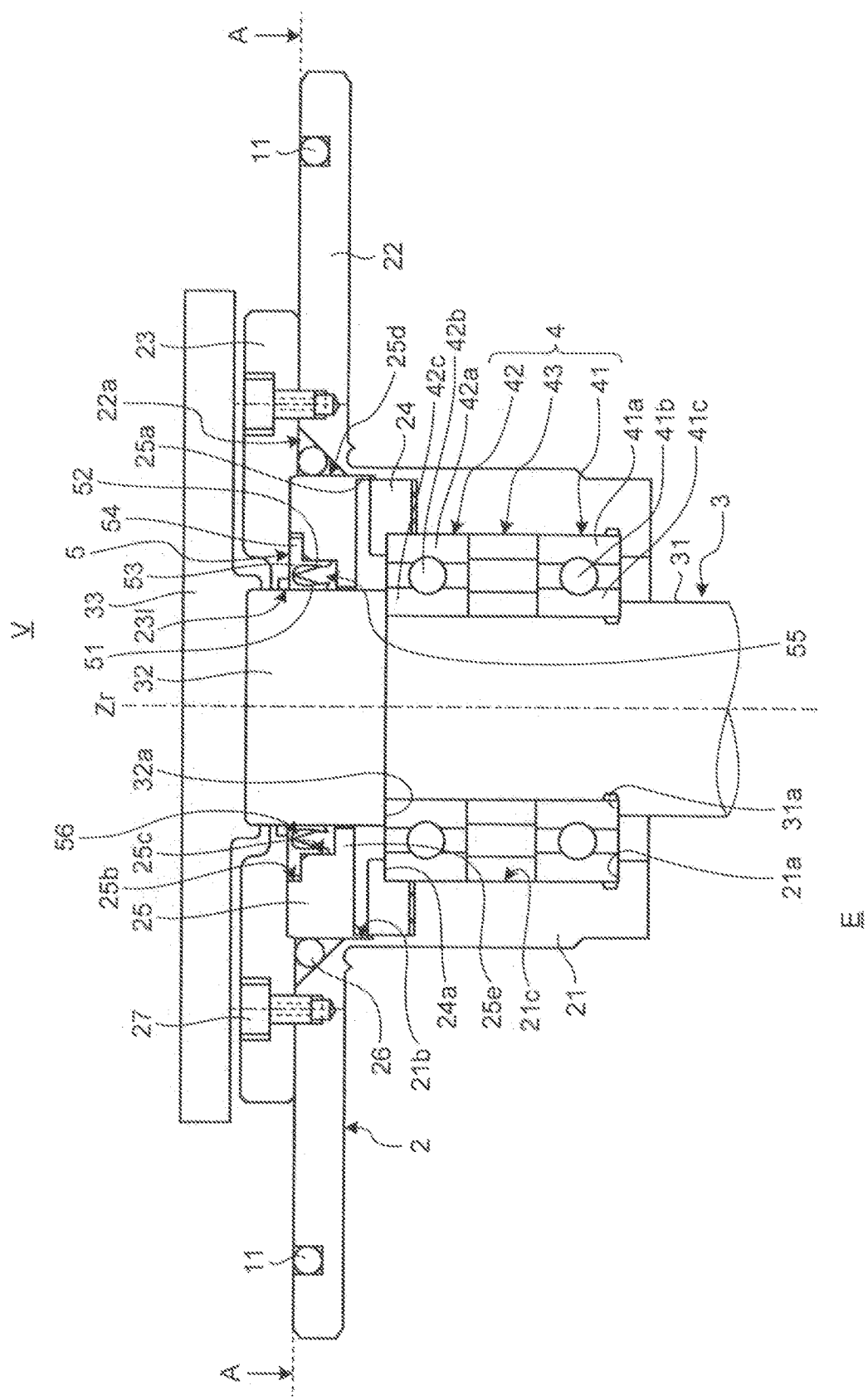
FIG. 2 is a cross-sectional view schematically illustrating the sealing mechanism according to the first embodiment.
Figure 3:
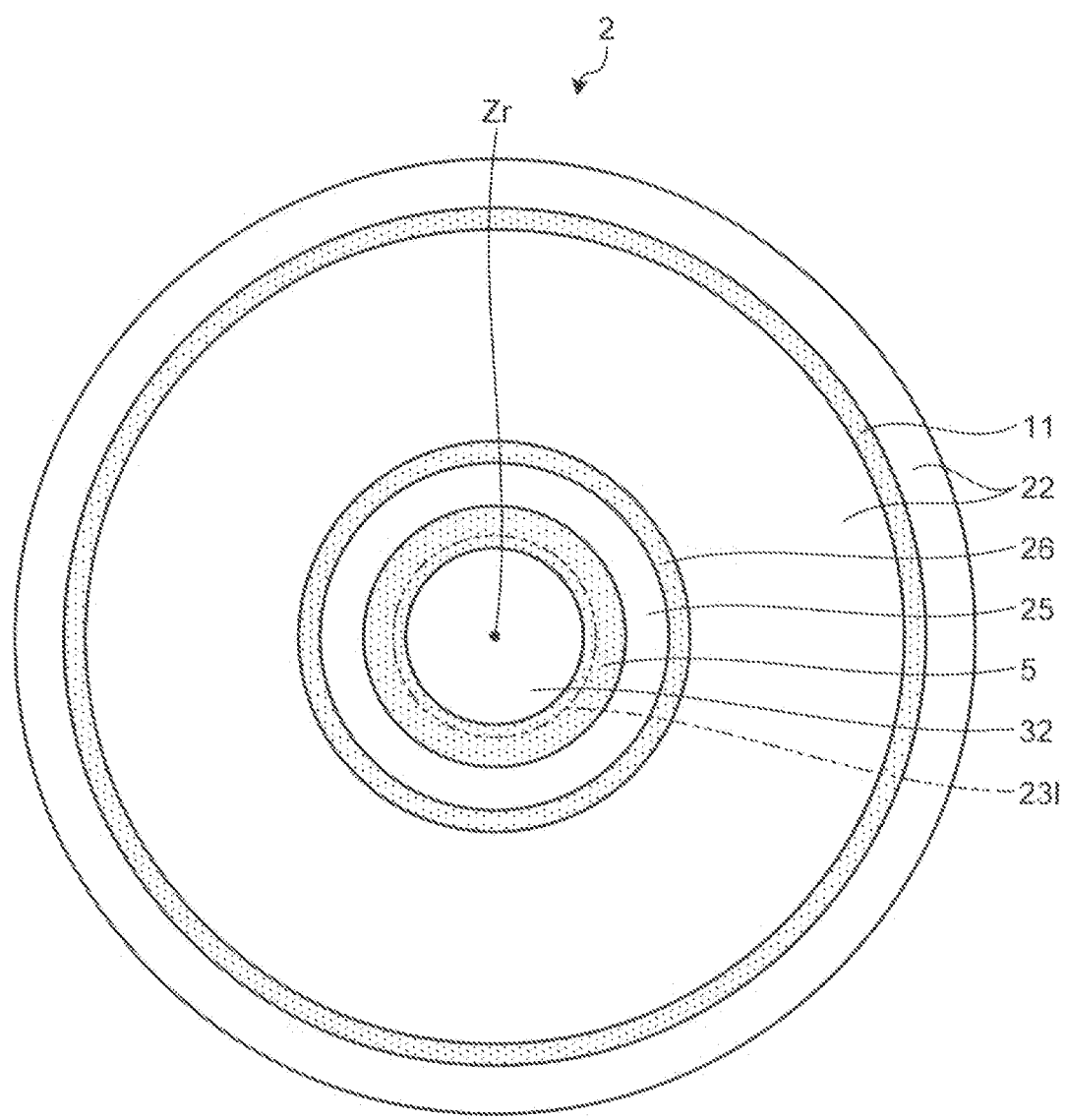
FIG. 3 is a view on arrow A-A of FIG. 2.
Figure 4:
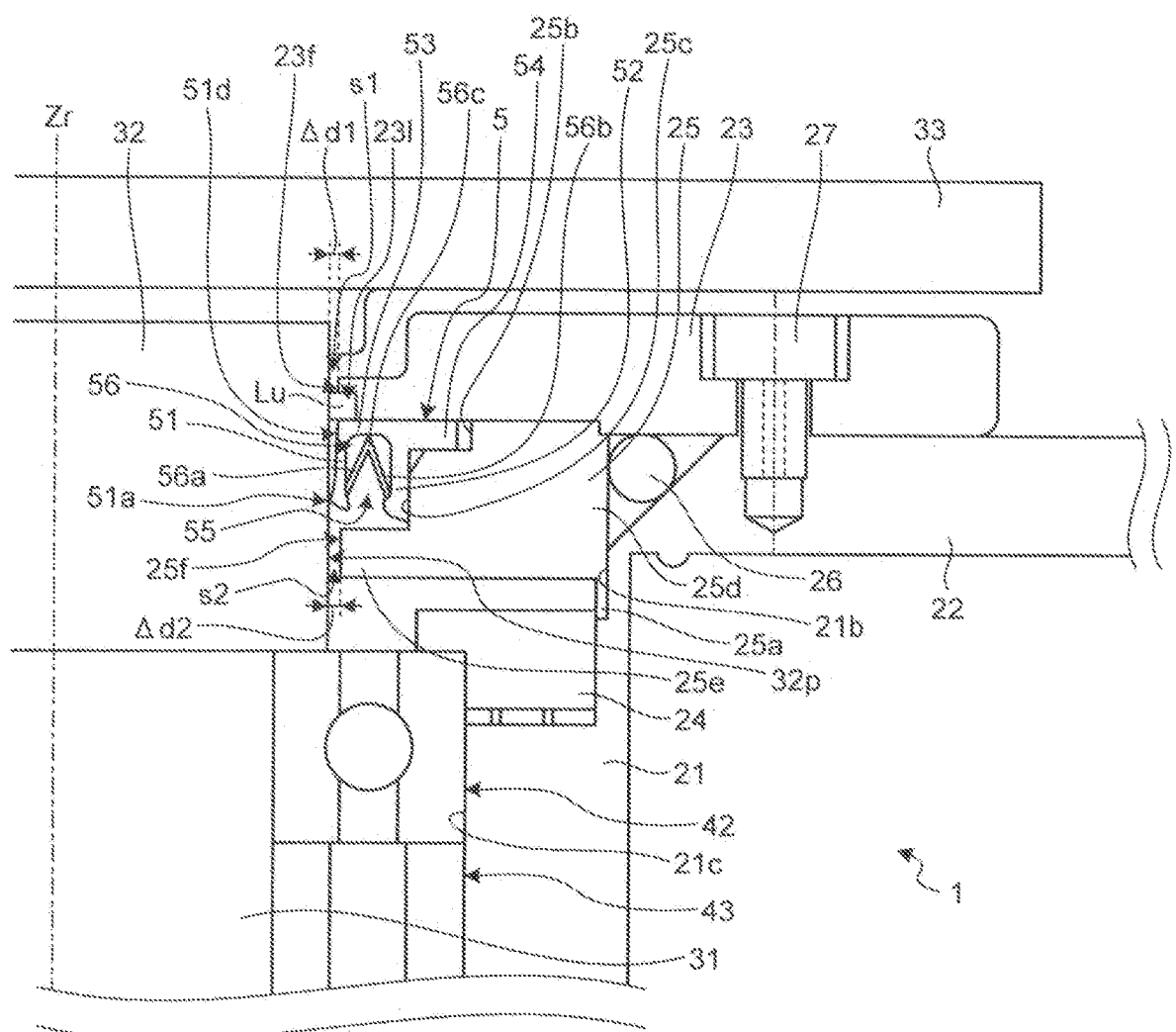
FIG. 4 is an enlarged view illustrating a gap of the sealing mechanism according to the first embodiment.

FIG. 1 is a cross-sectional view schematically illustrating a manufacturing device including a sealing mechanism according to a first embodiment. FIG. 2 is a cross-sectional view schematically illustrating the sealing mechanism according to the first embodiment. FIGS. 1 and 2 are the cross-section surfaces illustrating the sealing mechanism 1 taken along a plane including a rotational center axis Zr of the sealing mechanism 1 and parallel to the rotational center axis Zr. FIG. 3 is a view on arrow A-A of FIG. 2. FIG. 4 is an enlarged view illustrating a gap of the sealing mechanism according to the first embodiment. The sealing mechanism 1 is a mechanical element to transmit rotation and is used in a special environment such as a vacuum environment, a depressurized environment, and a process-gas-filled environment. The sealing mechanism 1 is applied to a manufacturing device for semiconductor manufacturing, machine tool manufacturing, etc., a conveyance device, and a rotary drive unit. Here, a description will be given for a case where the sealing mechanism 1 is a rotary drive unit (spindle unit) including a spindle as a rotary shaft in a manufacturing device for semiconductor manufacturing, but an object to which the sealing mechanism 1 is applied is not limited thereto.

As illustrated in FIG. 1, for example, a manufacturing device 100 used for semiconductor manufacturing includes the sealing mechanism 1, a frame body 10, an electric motor 8, and a control device 91 to control the electric motor 8. The sealing mechanism 1 and the electric motor 8 function as a drive unit 6 of the sealing mechanism and transmit rotation of the electric motor 8 to rotate a conveyance table (movable member) 33. After the internal space V of the frame body 10 is set to a vacuum environment, a depressurized environment, or a process-gas-filled environment, a conveyance device 7 in the manufacturing device 100 loads a conveyance object (such as a semiconductor substrate, a workpiece, or a tool) existing in an internal space V on the conveyance table (movable member) 33 to move the conveyance object. In the case of moving the conveyance object, a foreign matter may be generated by operation of the electric motor 8 when the electric motor 8 is installed in the internal space V. Considering this, in the manufacturing device 100, the electric motor 8 is installed in an external space E while keeping the conveyance table 33 in the internal space V. Further, the sealing mechanism 1 is a rotation mechanism that transmits power of the electric motor 8 installed in the external space E to the internal space V while separating the internal space V from the external space E and improving sealing performance. The electric motor 8 is, for example, a direct drive motor, a drive unit using a belt drive, a linear motor, a servo motor, and so on. The control device 91 includes an input circuit, a central processing unit (CPU) that is a central calculation processing unit, a memory that is a storage unit, and an output circuit. The manufacturing device 100 can manufacture a desired product by: controlling the electric motor 8 in accordance with a program stored in the memory; loading the conveyance object (such as a semiconductor substrate, a workpiece, or a tool) existing in the internal space V on the conveyance table (movable member) 33; and moving the same. The conveyance device 7 includes the conveyance table (movable table) 33 to move the conveyance object, and moves the conveyance object by linking rotary movement of a shaft 31 of the sealing mechanism 1 with movement of the conveyance table (movable member) 33.

The sealing mechanism 1 includes a housing 2, a rotary member 3, and a bearing 4. The housing 2 is a member to house the bearing 4. In the first embodiment, the housing 2 includes, as a housing body, a barrel portion 21 that is a cylindrical member, and a housing flange portion 22 provided at one end portion of the barrel portion 21. Additionally, the housing 2 further includes a lid portion 23, an outer ring stopper member 24, and a seal fixing spacer 25. The lid portion 23 is fixed to the housing flange portion 22 with a bolt 27. The outer ring stopper member 24 and the seal fixing spacer 25 are disposed inside the barrel portion 21 of the housing body. In the first embodiment, the barrel portion 21 is a tube-shaped member (for example, cylinder shape), and includes a through-hole directed from the one end portion to the other end portion. Further, in the first embodiment, the lid portion 23 is disposed on a vertically higher side than the seal fixing spacer 25.

The housing flange portion 22 is a plate-like flange member in all cases. In the first embodiment, a shape of the housing flange portion 22 is a circle shape in a planar view, but the shape is not limited thereto. The housing flange portion 22 includes the mentioned through-hole that includes the rotational center axis Zr of the shaft 31 and further penetrates in a thickness direction of the shaft 31. In the housing 2, the housing flange portion 22 is disposed so as to cover an opening portion 10e of the frame body 10 from the outside of the frame body 10, and fixed to the frame body 10 by fastening the housing flange portion 22 and a wall surface of the frame body 10 with a bolt (not illustrated). This enables the housing 2 to block the opening portion 10e of the frame body 10 from the outside of the frame body 10. The housing flange portion 22 includes an annular groove at a portion overlapping with the frame body 10 in a planar view, and an O-ring (annular seal) 11 is fitted into the annular groove to improve sealing performance between the housing flange portion 22 and the frame body 10.

The rotary member 3 includes the shaft 31, a rotary portion 32, and the conveyance table (movable member) 33. The shaft 31 is an output shaft (main shaft) of the sealing mechanism 1, and has one end portion inserted into the housing 2. The shaft 31 has the other portion connected to an output shaft 81 of the electric motor 8 via a coupling 82. The conveyance table (movable member) 33 is fixed to the one end portion of the shaft 31 via the rotary portion 32.

The conveyance table 33 and the rotary portion 32 are rotated together with the shaft 31. The conveyance table 33 has an object loaded on a surface on an opposite side of the one end portion of the shaft 31. In the first embodiment, the conveyance table 33 is a plate-like member, and has a circle shape in a planar view. The conveyance table 33 extends to the radial outside of the rotary portion 32 that projects more in the axial direction than the housing flange portion 22 of the housing 2.

The bearing 4 is disposed at the housing 2, inside the housing 2 in this first embodiment, and supports the shaft 31 in a rotatable manner. The bearing 4 includes a bearing 41 and a bearing 42 disposed apart from each other along the rotational center axis Zr via a bearing spacer 43 formed like a duplex cylinder. By this, the bearing 4 can suppress whirling vibration of the shaft 31 by supporting the shaft 31 at a plurality of points of the bearing 41 and the bearing 42. In the first embodiment, the shaft 31 is supported at the housing 2 by the two bearings 41, 42, but the number of bearings is not limited to two.

As illustrated in FIG. 2, the bearings 41, 42 include outer rings 41a, 42a, rolling elements 41b, 42b, and inner rings 41c, 42c, respectively. The inner rings 41c, 42c are disposed on a radially inner side of the outer rings 41a, 42a, respectively. Thus, in the first embodiment, both of the bearing 41, 42 are rolling bearings. The rolling elements 41b, 42b are disposed between the outer rings 41a, 42a and the inner rings 41c, 42c, respectively. In the bearings 41, 42, the outer rings 41a, 42a contact an inner wall 21c of the through-hole included in the barrel portion 21 of the housing 2.

An axial one end of the outer ring 41a contacts a positioning portion 21a formed by carving the through-hole included in the barrel portion 21. An outer ring presser 24a of the outer ring stopper member 24 positions and fixes an axial one end of the outer ring 42a. Therefore, the positioning portion 21a and the outer ring stopper member 24 axially sandwich and fix the bearing 41, bearing spacer 43, and bearing 42. With this structure, the bearings 41, 42 are mounted on the housing 2. In the first embodiment, both of the bearings 41, 42 are ball bearings, but the type of the bearings 41, 42 as the rolling bearings are not limited to the ball bearings. Further, in the first embodiment, both of the bearings 41, 42 are the rolling bearings, but may also be slide bearings.

The rotary portion 32 has a cylindrical shape, and a radial outer surface 32p thereof faces the housing 2 with a gap 55 having a predetermined size therebetween. The rotary portion 32 of the first embodiment 1 is coaxial with the shaft 31, but the rotary portion 32 has a diameter longer than the diameter of the shaft 31. Therefore, in the rotary portion 32, a side surface 32a on the opposite side of the conveyance table 33 is made to abut on the inner ring 42c and function as an inner ring presser. With this structure, the number of components is reduced, and the low-cost sealing mechanism 1 can be provided. An axial one end of the inner ring 41c contacts a positioning portion 31a at an outer peripheral recessed portion included in the shaft 31. Since the rotary portion 32 positions and fixes the axial one end of the inner ring 42c, the positioning portion 31a and the rotary portion 32 axially sandwich and fix the bearing 41, bearing spacer 43, and the bearing 42. With this structure, the bearings 41, 42 are mounted on the shaft 31. Meanwhile, the rotary portion 32 of the first embodiment is integrally formed with the shaft 31, and constitutes a part of the one end of the shaft 31. However, not limited to this embodiment, the rotary portion 32 of the first embodiment may be a separate body from the shaft 31, and may be a member coaxially fixed to the one end of the shaft 31 and rotated such that the rotation thereof is linked with rotation of the shaft 31.

The seal fixing spacer 25 determines a size of the gap 55 and further fixes an annular sealing member 5. As illustrated in FIG. 3, the seal fixing spacer 25 is an annular member. As illustrated in FIG. 2, the seal fixing spacer 25 includes: a spacer positioning portion 25a having an axially-extending portion on a radial outer peripheral side thereof; a seal fixing recessed portion 25b, a radial inner peripheral portion 25c, a radial outer peripheral portion 25d, and an annular projecting portion 25e projecting more than the radial inner peripheral portion 25c on the rotary portion 32 side. At least a part of the radial outer peripheral portion 25d contacts an inner wall 21b of the through-hole of the barrel portion 21. Since the seal fixing spacer 25 functions as a guide of the annular sealing member 5, an appropriate setting value can be set for a contact pressure of the annular sealing member 5 that contacts the rotary portion 32.

Further, in the housing flange portion 22, an annular groove 22a is formed concentrically with the rotational center axis Zr, and at least a part of the radial outer peripheral portion 25d constitutes a part of a wall surface of the annular groove 22a. When the lid portion 23 is fixed to the housing flange portion 22 with the bolt 27, an O-ring (second annular sealing member) 26 fitted into the annular groove 22a functions as a seal with improved sealing performance. Then, the O-ring (second annular sealing member) 26 is disposed at a position where a diameter thereof is larger than that of the annular sealing member 5. Further, the spacer positioning portion 25a is sandwiched and fixed between the outer ring stopper member 24 and the inner wall 21b of the through-hole of the barrel portion 21 described above. The annular groove 22a and the O-ring (second annular sealing member) 26 are not needed in the case where a vacuum level of the internal space V is low.

As illustrated in FIG. 3, the annular sealing member 5 is disposed so as to draw a concentric circle around the rotational center axis Zr in the same manner as the rotary portion 32, seal fixing spacer 25, O-ring (second annular sealing member) 26 fixed to the housing flange portion 22, and O-ring 11. Further, as illustrated in FIG. 2, the annular sealing member 5 is disposed closer than the bearing 4 to the internal space V that is a low-pressure side space of the two spaces having different pressures. With this structure, the annular sealing member 5 prevents a lubricant and the like used in the bearing 4 from spattering on the internal space V side.

As illustrated in FIG. 4, the annular sealing member 5 includes a fixing portion 52 that contacts the radial inner peripheral portion 25c of the seal fixing spacer 25 of the housing 2, a lip portion 51 that contacts the radial outer surface 32p of the rotary portion 32, an annular connecting unit 53 that connects the fixing portion 52 to the lip portion 51, and a seal flange portion 54. With this structure, the fixing portion 52, annular connecting unit 53, and lip portion 51 form a U-shape in a cross-section, and a space surrounded by the fixing portion 52, annular connecting unit 53, and lip portion 51 are opened toward the external space E that is a high-pressure side space of the two spaces having different pressures. A material of the annular sealing member 5 is, preferably, polyethylene or polytetrafluoroethylene. As the material of the annular sealing member 5, polyethylene or polytetrafluoroethylene has excellent resistance to abrasion and resistance to chemicals, and is suitable for lubrication with the rotary portion 32. Material quality of the rotary portion 32 to be contacted is, preferably, any one of high carbon chromium bearing steel material, martensitic stainless steel, precipitation hardening stainless steel, and high silicon alloy of precipitation hardening stainless containing 3.4 mass % or more of Si.

As illustrated in FIG. 4, when the lid portion 23 is fixed to the housing flange portion 22 with the bolt 27, the seal fixing spacer 25 sandwiches and fixes the seal flange portion 54 inserted into the seal fixing recessed portion 25b. By this, the annular sealing member 5 includes the seal flange portion 54. Therefore, the sealing mechanism 1 of the first embodiment can reduce possibility that the annular sealing member 5 is rotated together with rotation of the rotary portion 32.

Since the rotary portion 32 is rotated in a state that the annular sealing member 5 is fixed to the housing 2, friction is caused between the annular sealing member 5 and the rotary portion 32. Heat generation caused by this friction may accelerate abrasion of the annular sealing member 5 or the rotary portion 32. Therefore, reducing such friction is desired. Considering this, the sealing mechanism 1 includes a lubricant groove 23l that stores a lubricant Lu to be supplied between the annular sealing member 5 and the radial outer surface 32p of the rotary portion 32.

The lid portion 23 includes a radial inner side surface 23f facing the radial outer surface 32p of the rotary portion 32 on a low pressure side relative to the annular sealing member 5. The radial inner side surface 23f is located on the vertically higher side than the position of the annular sealing member 5. The lubricant groove 23l is a recessed portion provided at the radial inner side surface 23f. The lubricant groove 23l is formed in an annular shape as indicated by a two-dot chain line in FIG. 3. The lubricant Lu stored in the lubricant groove 23l is, for example, grease. For example, the lubricant Lu partly spreads out of the lubricant groove 23l and contacts the radial outer surface 32p due to surface tension. By this, the lubricant Lu is held by the lubricant groove 23l and the radial outer surface 32p. Further, since the lubricant Lu has flowability, the lubricant is stably supplied between the annular sealing member 5 and the radial outer surface 32p of the rotary portion 32 from the lubricant groove 23l by gravity. This easily keeps a state that the lubricant Lu is present between the rotary portion 32 and the annular sealing member 5. Therefore, abrasion of the annular sealing member 5 or the rotary portion 32 is suppressed, and frequency of replacing a component that improves sealing performance can be reduced in the sealing mechanism 1 according to the first embodiment.

Further, surfaces of annular sealing member 5 and the rotary portion 32 have a certain level of surface roughness including fine unevenness. Therefore, sealing performance at a portion where the annular sealing member 5 contacts the rotary portion 32 may depend on the level of surface roughness. In the first embodiment, since the lubricant Lu is supplied to the surfaces of the annular sealing member 5 and the rotary portion 32, the lubricant Lu is filled into recessed portions included in the surface roughness. Therefore, in the sealing mechanism 1, the surface roughness of the annular sealing member 5 and the rotary portion 32 is improved by the lubricant Lu, and sealing performance can be improved.

The lubricant groove 23l is provided at a part of the radial inner side surface 23f as illustrated in FIG. 4. Further, the radial inner side surface 23f is located closer than the position of the annular sealing member 5 to the low pressure side. The lid portion 23 can adjust a vacuum level by suitably setting a distance Δd1 of a gap s1 between the radial outer surface 32p and a portion in the radial inner side surface 23f, the portion being located closer than the lubricant groove 23l to the low pressure side. Preferably, the distance Δd1 is 0.001 mm or more and 0.5 mm or less, for example. Further, the distance Δd1 is smaller than the size of the gap 55. This makes the lubricant Lu hardly pass through an area between the radial inner side surface 23f and the radial outer surface 32p. Therefore, a situation that the lubricant Lu is spattered on the internal space V side is suppressed. In the same manner, the annular projecting portion 25e can adjust a vacuum level by appropriately setting a distance Δd2 of a gap s2 between a radial inner side surface 25f and the radial outer surface 32p. Preferably, the distance Δd2 is 0.001 mm or more and 0.5 mm or less, for example. In the case of making the distance Δd2 short, the lubricant Lu can be easily held at the gap 55.

As illustrated in FIG. 4, a biasing member 56 is disposed inside the space surrounded by the fixing portion 52, annular connecting unit 53, and lip portion 51, and pressing force of the lip portion 51 can be biased toward the rotary portion 32 side. The biasing member 56 is, for example, made of stainless steel or the like, and in all cases, the biasing member is an elastic body formed in a V-shape in a cross-sectional view obtained by bending, at a bending portion 56c, a plate-like portion 56a and a plate-like portion 56b both of which are formed in flat plates. The biasing member 56 performs biasing such that ends of the plate-like portion 56a and plate-like portion 56b are mutually outstretched.

In the annular sealing member 5, the lip portion 51 has the pressure caused by elastic deformation of the lip portion 51 and receives the pressure applied to the biasing member 56, thus the lip portion 51 contacts the radial outer surface 32p of the rotary portion 32. Therefore, the sealing mechanism 1 can increase a contact pressure of the lip portion 51 to the radial outer surface 32p of the rotary portion 32. Further, the space surrounded by the fixing portion 52, annular connecting unit 53, and lip portion 51 is opened to the external space E that is the high-pressure side space of the two spaces having different pressures. Therefore, a pressure difference between the two spaces having different pressures can increase the contact pressure of the lip portion 51 that contacts the radial outer surface 32p of the rotary portion 32. This enables the sealing mechanism 1 to keep high sealing performance even when the internal space V is highly vacuumed. Further, not only an inner peripheral side end 51a of the lip portion 51 contacts the radial outer surface 32p but also at least a part of an inner peripheral side base portion 51d of the lip portion 51 close to the annular connecting unit 53 contacts the radial outer surface 32p. As a result, the sealing performance can be secured because the inner peripheral side of the lip portion 51 comes into surface contact with the radial outer surface 32p.

Even when abrasion or deformation is caused at the lip portion 51 or the shaft 31, the biasing member 56 functions so as to secure the contact pressure. Therefore, the sealing mechanism 1 can reduce frequency of replacing the annular sealing member 5 or the rotary portion 32 serving as components that improve sealing performance.

The space surrounded by the lip portion 51, annular connecting unit 53, and fixing portion 52 is opened to the external space E on the high pressure side of the two spaces that are the internal space V and the external space E having the different pressures. With this structure, the pressure caused by own elastic deformation of the lip portion 51 of the annular sealing member 5 and the pressure applied by the biasing member 56 synergistically work, and the contact pressure of the annular sealing member 5 that contacts the rotary portion 32 can be increased.

Preferably, the biasing member 56 is provided in the space surrounded by the fixing portion 52, annular connecting unit 53, and lip portion 51. With this structure, the lip portion 51 can easily come into surface contact with the rotary portion 32.

As described above, the sealing mechanism 1 can function as a separator between the two spaces that are the internal space V and the external space E having different pressures. The sealing mechanism 1 includes: the housing 2; the shaft 31 inserted into the housing 2; the bearing 4 provided at the housing 2 and supporting the shaft 31 in a rotatable manner; and the rotary portion 32 provided at the one end portion of the shaft 31, rotated together with the shaft 31, and further having the radial outer surface 32p facing the seal fixing spacer 25 of the housing 2 with the gap 55 having the predetermined size therebetween. Further, the sealing mechanism 1 includes: the annular sealing member 5 that seals the gap 55; and the lubricant groove 23l that stores the lubricant Lu to be supplied between the annular sealing member 5 and the radial outer surface 32p of the rotary portion 32. This easily keeps the state that the lubricant Lu is present between the rotary portion 32 and the annular sealing member 5. Therefore, abrasion of the annular sealing member 5 or the rotary portion 32 is suppressed, and frequency of replacing a component that improves sealing performance can be reduced in the sealing mechanism 1 according to the first embodiment.

Further, in the sealing mechanism 1, the housing 2 includes: the seal fixing spacer 25 that determines the size of the gap 55 and further fixes the annular sealing member 5; and the lid portion 23 that fixes the seal fixing spacer 25. Furthermore, the radial inner side surface 23f of the lid portion 23 is located on the vertically higher side than the position of the annular sealing member 5, and the lubricant groove 23l is provided at the radial inner side surface 23f of the lid portion 23. By this, the lubricant Lu is stably supplied between the annular sealing member 5 and the radial outer surface 32p of the rotary portion 32 from the lubricant groove 23l by gravity.

Further, in the sealing mechanism 1, the radial inner side surface 23f of the lid portion 23 is located closer than the position of the annular sealing member 5 to the low pressure side of the two spaces having different pressures, and the lubricant groove 23l is provided at a part of the radial inner side surface 23f of the lid portion 23. Furthermore, the distance $\Delta d1$ is smaller than the size of the gap 55. The distance $\Delta d1$ is a distance between the radial outer surface 32p of the rotary portion 32 and a portion in the radial inner side surface 23f of the lid portion 23, the portion being located closer than the lubricant groove 23l to the low pressure side of the two spaces having different pressures. This makes the lubricant Lu hardly pass through the area between the radial inner side surface 23f and the radial outer surface 32p. Therefore, the situation that the lubricant Lu is spattered on the internal space V side is suppressed.

First Modified Example of First Embodiment

Figure 5:
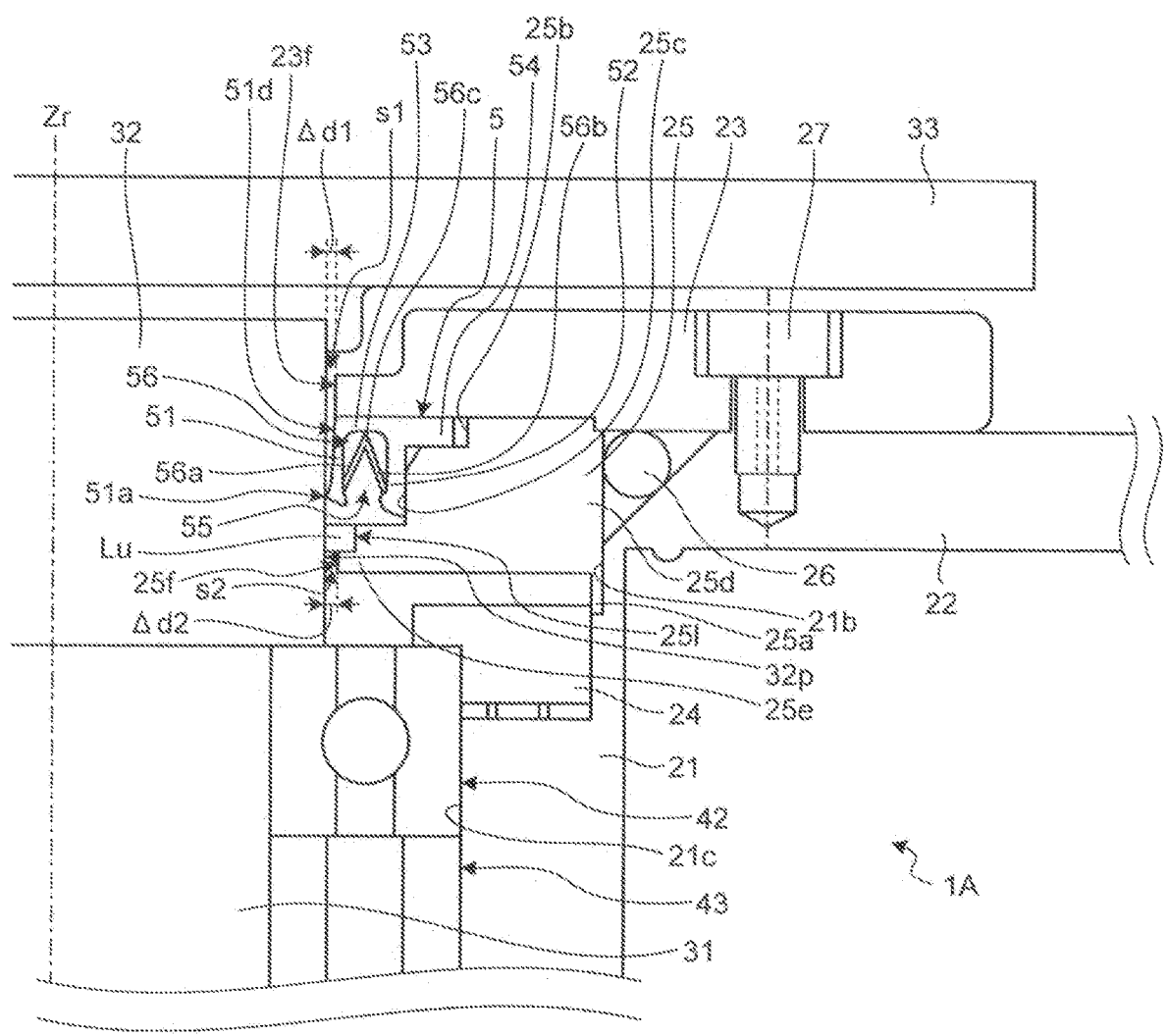
FIG. 5 is an enlarged view illustrating a gap of a sealing mechanism according to a first modified example of the first embodiment.

FIG. 5 is an enlarged view illustrating a gap of a sealing mechanism according to a first modified example of the first embodiment. Components that are the same as the above-described components will be denoted by the same reference signs, and a description therefor will be omitted. In a sealing mechanism 1A according to the first modified example of the first embodiment, the radial inner side surface 25f of the seal fixing spacer 25 is disposed so as to be located on the vertically higher side than the annular sealing member 5. Therefore, an upper side of FIG. 5 is a vertically lower side, and a lower side of FIG. 5 is a vertically higher side. The sealing mechanism 1A according to the first modified example of the first embodiment includes a lubricant groove 25l that stores a lubricant Lu to be supplied between the annular sealing member 5 and the radial outer surface 32p of the rotary portion 32.

The seal fixing spacer 25 includes the radial inner side surface 25f. The radial inner side surface 25f faces the radial outer surface 32p of the rotary portion 32 and is located closer than the annular sealing member 5 to the high pressure side. The radial inner side surface 25f is located on the vertically higher side than the position of the annular sealing member 5. The lubricant groove 25l is an annular recessed portion provided at the radial inner side surface 25f of the seal fixing spacer 25. The lubricant Lu stored in the lubricant groove 25l is, for example, grease. For example, the lubricant Lu partly spreads out of the lubricant groove 25l and contacts the radial outer surface 32p due to surface tension. By this, the lubricant Lu is held by the lubricant groove 25l and the radial outer surface 32p. Further, since the lubricant Lu has flowability, the lubricant is stably supplied between the annular sealing member 5 and the radial outer surface 32p of the rotary portion 32 from the lubricant groove 25l by gravity. By this, even in the case where the lid portion 23 is disposed on the vertically lower side than the annular sealing member 5, the lubricant Lu is stably supplied between the annular sealing member 5 and the radial outer surface 32p of the rotary portion 32 from the lubricant groove 25l by gravity. Therefore, in the sealing mechanism 1A according to the first modified example of the first embodiment, frequency of replacing a component that improves sealing performance can be reduced even in the case where the lid portion 23 is disposed on the vertically lower side than the annular sealing member 5.

Further, the radial inner side surface 25f of the seal fixing spacer 25 is located closer than the position of the annular sealing member 5 to the high pressure side. Furthermore, the radial inner side surface 23f of the lid portion 23 is located closer than the position of the annular sealing member 5 to the low pressure side. The vacuum level can be adjusted by appropriately setting the distance Δd1 of the gap s1 between the radial inner side surface 23f and the radial outer surface 32p. Preferably, the distance Δd1 is 0.001 mm or more and 0.5 mm or less, for example. Further, the distance Δd1 is smaller than the size of the gap 55. This makes the lubricant Lu hardly pass through an area between the radial inner side surface 23f and the radial outer surface 32p. Therefore, a situation that the lubricant Lu is spattered on the internal space V side is suppressed. In the same manner, the annular projecting portion 25e can adjust the vacuum level by appropriately setting the distance Δd2 of the gap s2 between the radial inner side surface 25f and the radial outer surface 32p. Preferably, the distance Δd2 is 0.001 mm or more and 0.5 mm or less, for example. In the case of making the distance Δd2 short, the lubricant Lu can be easily held at the gap 55.

Second Modified Example of First Embodiment

Figure 6:
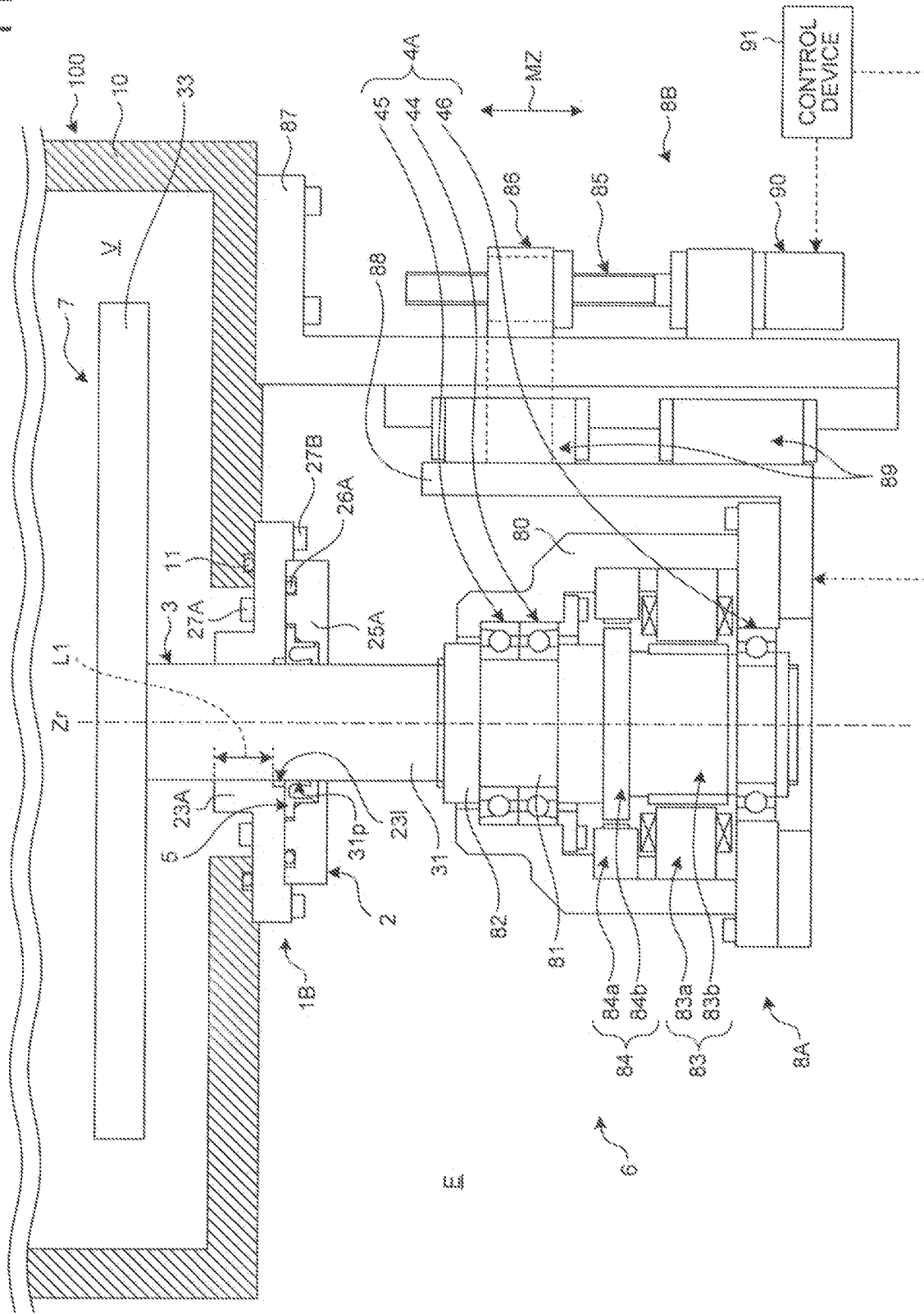
FIG. 6 is a cross-sectional view schematically illustrating a sealing mechanism according to a second modified example of the first embodiment.

FIG. 6 is a cross-sectional view schematically illustrating a sealing mechanism according to a second modified example of the first embodiment. A sealing mechanism 1B according to the second modified example of the first embodiment can function as a separator between the two spaces having different pressures in the same manner as the first embodiment and the first modified example of the first embodiment, but is different in that the shaft 31 can be linearly moved in an axial direction of the shaft 31 in addition to rotary movement. Components that are the same as the above-described components will be denoted by the same reference signs, and a description therefor will be omitted.

The sealing mechanism 1B according to the second modified example of the first embodiment includes the housing 2 and the rotary member 3. Unlike the above-described first embodiment, the housing 2 does not house a bearing 4, and the shaft 31 passes therethrough. Thus, unlike the above-described first embodiment, an axial position of the shaft 31 is not restricted by the bearing 4 or the like in the sealing mechanism 1B according to the second modified example of the first embodiment. In the second modified example of the first embodiment, the housing 2 includes, as the housing body, a seal fixing spacer 25A and a lid portion 23A. The seal fixing spacer 25A and the lid portion 23A are stacked in the axial direction. The lid portion 23A according to the second modified example of the first embodiment is fixed to the seal fixing spacer 25A with a fixing member 27A such as a bolt. The lid portion 23A according to the second modified example of the first embodiment includes a portion overlapping with the frame body 10 in a planar view and fixed to the frame body 10 with a fixing member 27B such as a bolt, in the same manner as the housing flange portion 22 according to the first embodiment. The lid portion 23A according to the second modified example of the first embodiment includes an annular groove at the portion overlapping with the frame body 10 in a planar view, and an O-ring (annular seal) 11 is fitted into the annular groove and improves sealing performance between the lid portion 23A and the frame body 10. The lid portion 23A is fixed to the seal fixing spacer 25A with the fixing member 27A such as a bolt, and thus an O-ring (second annular sealing member) 26A fitted into the annular groove functions as a seal with improved sealing performance. Further, the lid portion 23A contacts an axial one end of the seal fixing spacer 25A. Further, the O-ring (second annular sealing member) 26A is disposed at a position where a diameter thereof is larger than that of the annular sealing member 5.

The lid portion 23A includes the lubricant groove 23l at the annular sealing member 5 close to the internal space V, and stores a lubricant in the lubricant groove 23l for the annular sealing member 5. By this, the annular sealing member 5 is constantly supplied with the lubricant from the lubricant groove 23l. A length L1 from a surface of the lid portion 23A on the internal space V side to the lubricant groove 23l is, preferably, equal to or more than a stroke corresponding to a maximum length allowed by linear movement of the shaft 31. This enables the sealing mechanism 1B according to the second modified example of the first embodiment to suppress decrease (deterioration) of the vacuum level caused by the lubricant adhered to a surface of the shaft 31 from the lubricant groove 23l in the case where, for example, the internal space V is in a high vacuum environment. Here, in order to secure the length L1, in the sealing mechanism 1B according to the second modified example of the first embodiment, an end portion on the internal space V side of the lid portion 23A includes a cylindrical portion having a cylindrical shape, and an outer peripheral side of the cylindrical portion is formed uneven. The structure to secure the length L1 is not limited to the above unevenness, and the sealing mechanism 1B according to the according to the second modified example of the first embodiment can be downsized by using the lid portion 23A.

The drive unit 6 of the sealing mechanism according to the second modified example of the first embodiment includes a rotary drive unit 8A and a linear drive unit 8B. The rotary drive unit 8A and the linear drive unit 8B are connected by a linear guiding mechanism 89.

The rotary member 3 includes the shaft 31 and the conveyance table (movable member) 33. The shaft 31 is an output shaft (main shaft) of the sealing mechanism 1B, and has one end portion inserted into the housing 2. The shaft 31 has the other portion connected to the output shaft 81 of a motor unit 83 of the rotary drive unit 8A via the coupling 82. The conveyance table (movable member) 33 is fixed to the one end portion of the shaft 31.

The rotary drive unit 8A includes the motor unit 83 and a detector 84 to detect rotation of the output shaft 81 inside a motor housing 80. The motor unit 83 includes a motor stator 83a and a motor rotor 83b inside the motor housing 80.

The motor unit 83 is supported by a bearing 4A formed by combining bearings 44, 45, 46 such that the motor rotor 83b can be freely rotated around the rotational center axis Zr relative to the motor housing 80. The motor housing 80 is formed in a hollow cylindrical shape around the rotational center axis Zr, and the motor stator 83a and outer rings of the bearing 44, 45, 46 are fixed to an inner peripheral side of the motor housing 80. Further, inner rings of the bearings 44, 45, 46 are fixed to an outer periphery of the output shaft 81. The bearing 4A can also support the shaft 31 in a rotatable manner because the other end portion of the shaft 31 is connected to the output shaft 81 of the motor unit 83 of the rotary drive unit 8A via the coupling 82.

An exciting coil is wound around the motor stator 83a via an insulating insulator. The motor stator 83a has a cylindrical body having a cylindrical shape manufactured by stacking thin plates such as an electromagnetic steel plate and a cold-rolled steel sheet by means of bonding, boss, caulking, and the like. The exciting coil is a liner wire and able to generate a rotation magnetic field by receiving power supply under control of a control device 91 and exciting the motor stator 83a. The motor stator 83a is a so-called stator of the motor unit 83.

In the motor rotor 83b, magnets are fixed on an outer peripheral side of a core material around the rotational center axis Zr. In the motor rotor 83b, the plurality of magnets are provided in a circumferential direction and attached along an outer peripheral surface on a radially outer side of the motor rotor 83b. The magnets are permanent magnets, and S poles and N poles are alternately arranged at equal intervals in the circumferential direction of the motor rotor 83b. This type of motor rotor 83b can be called as a permanent magnet (PM) type rotor. The motor rotor 83b is rotated in accordance with the rotation magnetic field excited at teeth of the motor stator core by the exciting coil.

The detector 84 is, for example, a resolver device and positioned at an end portion in the axial direction (direction parallel to rotation center) of the motor unit 83. The detector 84 includes a resolver stator 84a and a resolver rotor 84b. The resolver rotor 84b is connected to one end of the motor rotor 83b. The resolver stator 84a is fixed at the motor housing 80. The detector 84 can output a detection signal from the resolver stator 84a in accordance with rotation of the resolver rotor 84b linked with rotation of the motor rotor 83b. The control device 91 receives the detection signal from the resolver stator 84a and can detect rotation of the output shaft 81. The detector 84 is not limited to the resolver device and may also be, for example, another magnetic sensor or rotation detection sensor.

The linear drive unit 8B includes a drive motor 90, a screw shaft 85, a connecting unit 86, a support member 87, a positioning portion 88, and the linear guiding mechanism 89. The drive motor 90 is an electric motor same as the electric motor 8. The structure of the linear drive unit 8B is not limited thereto. The linear drive unit 8B may be any linear drive unit that provides freedom of movement in linear movement parallel to the axial direction of the shaft 31.

The drive motor 90 has a base position fixed by the support member 87 relative to the frame body 10. The screw shaft 85 and the connecting unit 86 form a ball screw mechanism, and the drive motor 90 converts transmitted rotation of the screw shaft 85 to linear movement and then moves the connecting unit 86 in a MZ direction parallel to an extending direction of the screw shaft 85 (axial direction of the screw shaft 85). The connecting unit 86 is connected to the positioning portion 88, and the position of the positioning portion 88 moves together with a position determined based on guide of the linear guiding mechanism 89 in accordance with linear movement of the connecting unit 86. The positioning portion 88 is a table, and the rotary drive unit 8A is mounted on an upper surface thereof. Therefore, the linear drive unit 8B can linearly move the shaft 31 together with the rotary drive unit 8A along the axial direction of the shaft 31 (linear movement).

The control device 91 according to the second modified example of the first embodiment controls the motor unit 83 of the rotary drive unit 8A and the drive motor 90 of the linear drive unit 8B to provide the shaft 31 with at least one of rotary movement and linear movement. Therefore, the control device 91 according to the second modified example of the first embodiment can control the motor unit 83 of the rotary drive unit 8A and the drive motor 90 of the linear drive unit 8B so as to provide the conveyance table (movable member) 33 with at least one of rotary movement and linear movement. Further, the conveyance device 7 includes the conveyance table (movable member) 33 to move a conveyance object. The conveyance device 7 moves the conveyance object by linking movement of the conveyance table (movable member) 33 with at least one of rotary movement and linear movement of the shaft 31.

In the annular sealing member 5 according to the second modified example of the first embodiment also, the shaft 31 performs at least one of rotary movement and linear movement in a state that the annular sealing member 5 is fixed to the housing 2. Therefore, friction is caused between the annular sealing member 5 and the shaft 31. Since the sealing mechanism 1B according to the second modified example of the first embodiment includes the annular sealing member 5 and the lubricant groove 23l to store the lubricant, a state that the lubricant is present between a radial outer surface 31p of the shaft 31 and the annular sealing member 5 can be easily secured. Therefore, abrasion of the annular sealing member 5 or the shaft 31 is suppressed, and frequency of replacing a component that improves sealing performance can be reduced in the sealing mechanism 1B according to the second modified example of the first embodiment.

Stress of rotary movement and linear movement is applied to the annular sealing member 5 according to the second modified example of the first embodiment. Therefore, preferably, strength of the annular sealing member 5 is stronger than strength of elasticity modulus of 0.1 GPa.

Third Modified Example of First Embodiment

Figure 7:
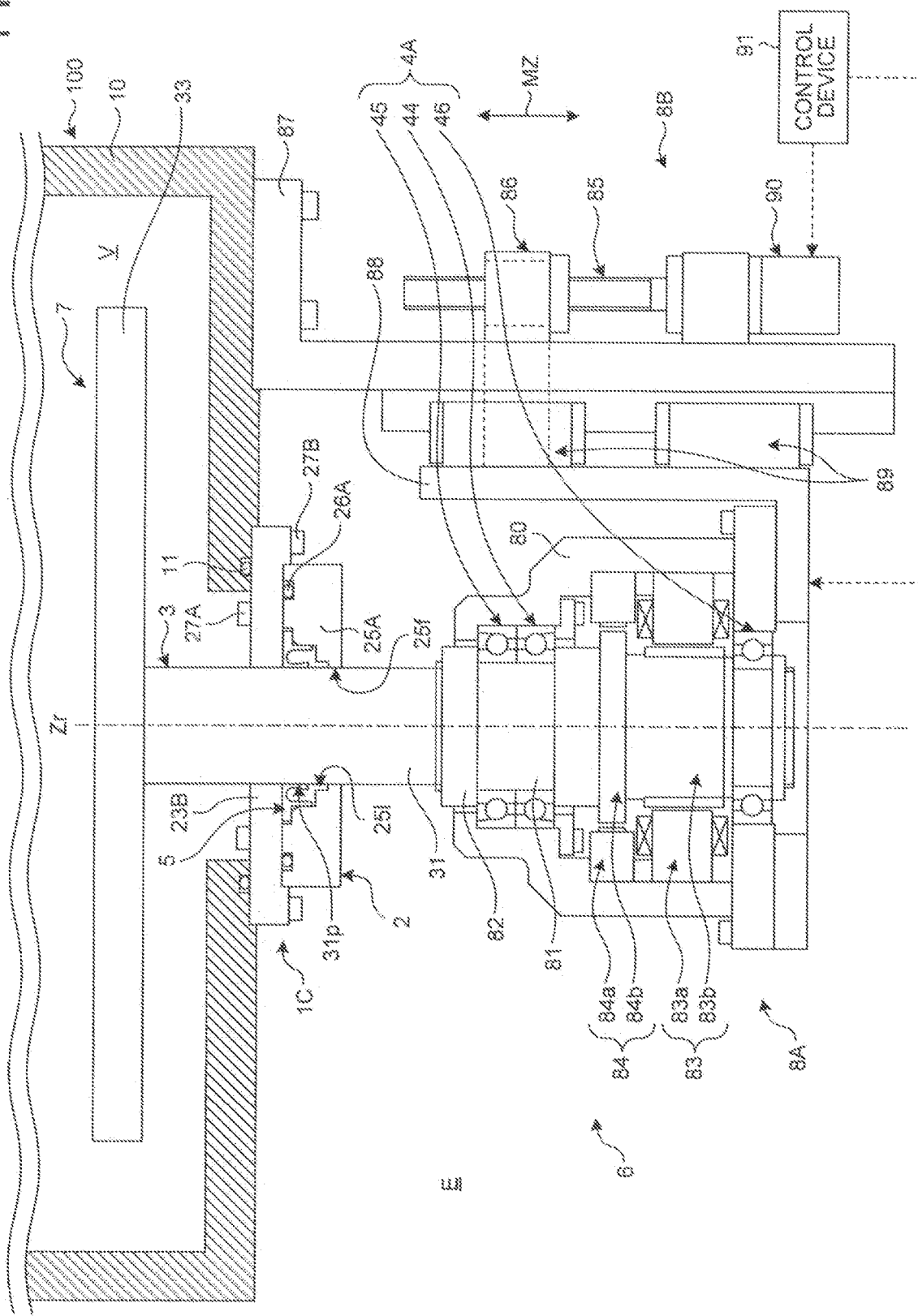
FIG. 7 is a cross-sectional view schematically illustrating a sealing mechanism according to a third modified example of the first embodiment.

FIG. 7 is a cross-sectional view schematically illustrating a sealing mechanism according to a third modified example of the first embodiment. Components that are the same as the above-described components will be denoted by the same reference signs, and a description therefor will be omitted.

A sealing mechanism 1C according to the third modified example of the first embodiment includes, as a housing body, the seal fixing spacer 25A and a lid portion 23B. The seal fixing spacer 25A and the lid portion 23B are stacked in an axial direction.

In the sealing mechanism 1C according to the third modified example of the first embodiment, the radial inner side surface 25f of the seal fixing spacer 25A is located on the vertically higher side than the annular sealing member 5. Therefore, an upper side of FIG. 7 is a vertically lower side, and a lower side of FIG. 7 is a vertically higher side. The sealing mechanism 1C according to the third modified example of the first embodiment includes the lubricant groove 25l.

The lubricant groove 25l is the annular recessed portion provided at the radial inner side surface 25f of the seal fixing spacer 25A. The lubricant is stored in the lubricant groove 25l. For example, the lubricant partly spreads out of the lubricant groove 25l and contacts the radial outer surface 31p of the shaft 31 due to surface tension. By this, the lubricant is held by the lubricant groove 25l and the radial outer surface 31p. Further, since the lubricant has flowability, the lubricant is stably supplied between the annular sealing member 5 and the radial outer surface 31p of the shaft 31 from the lubricant groove 25l by gravity. By this, even in the case where the lid portion 23B is disposed on the vertically lower side than the annular sealing member 5, the lubricant is stably supplied between the annular sealing member 5 and the radial outer surface 31p of the shaft 31 from the lubricant groove 25l by gravity. Therefore, in the sealing mechanism 1C according to the third modified example of the first embodiment, frequency of replacing a component that improves sealing performance can be reduced even in the case where the lid portion 23B is disposed on the vertically lower side than the annular sealing member 5.

Second Embodiment

Figure 8:
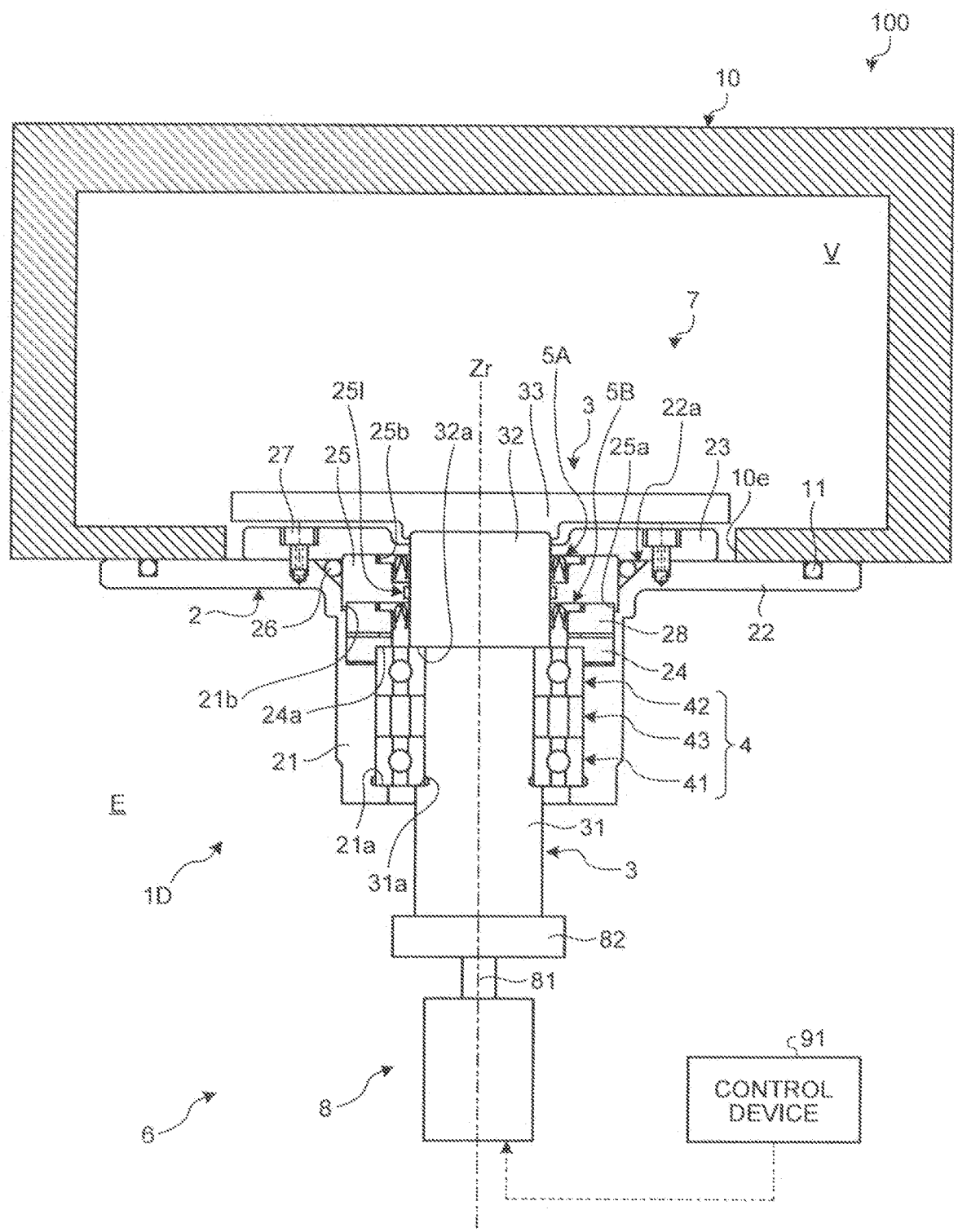
FIG. 8 is a cross-sectional view schematically illustrating a manufacturing device including a sealing mechanism according to a second embodiment.
Figure 9:
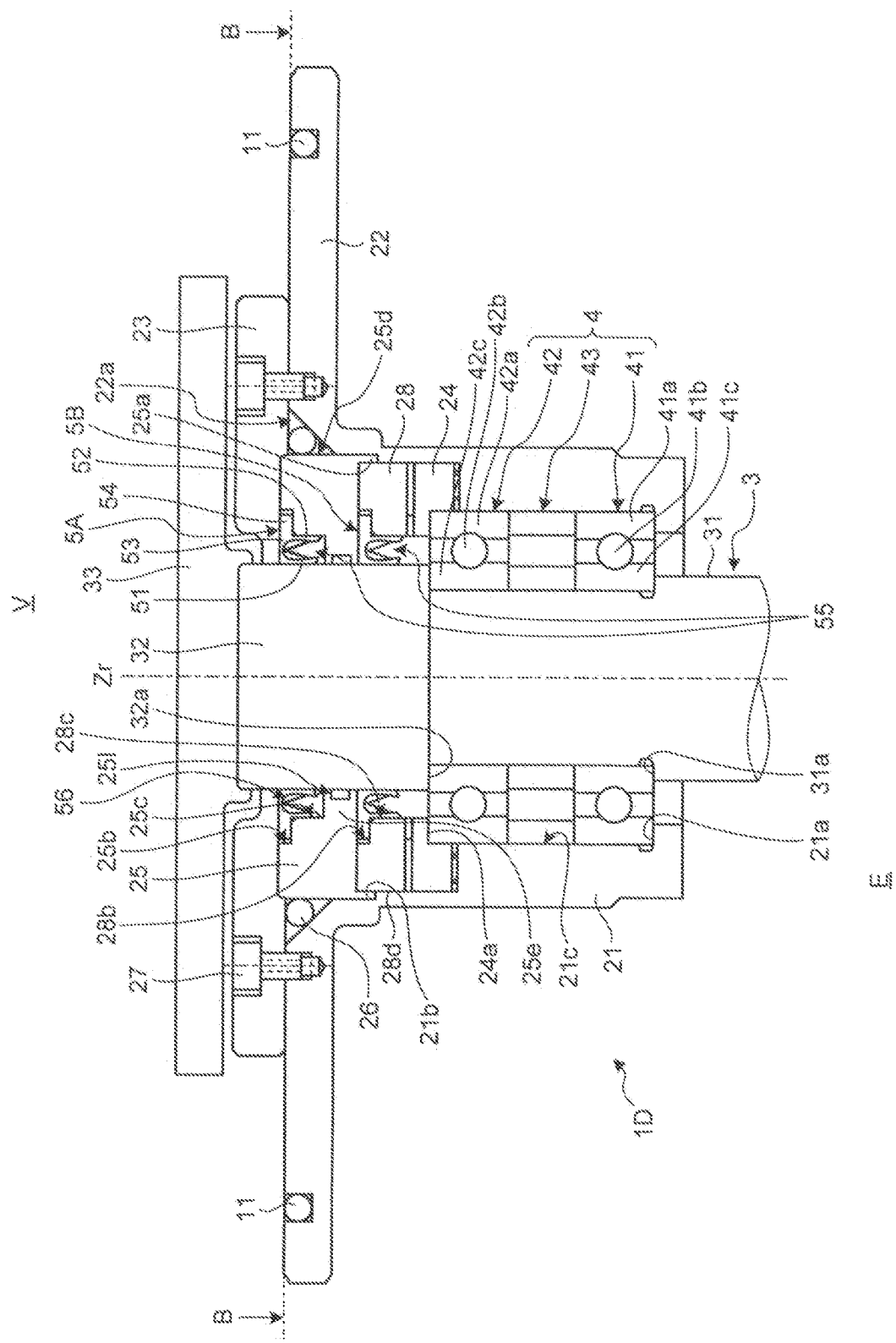
FIG. 9 is a cross-sectional view schematically illustrating the sealing mechanism according to the second embodiment.
Figure 10:
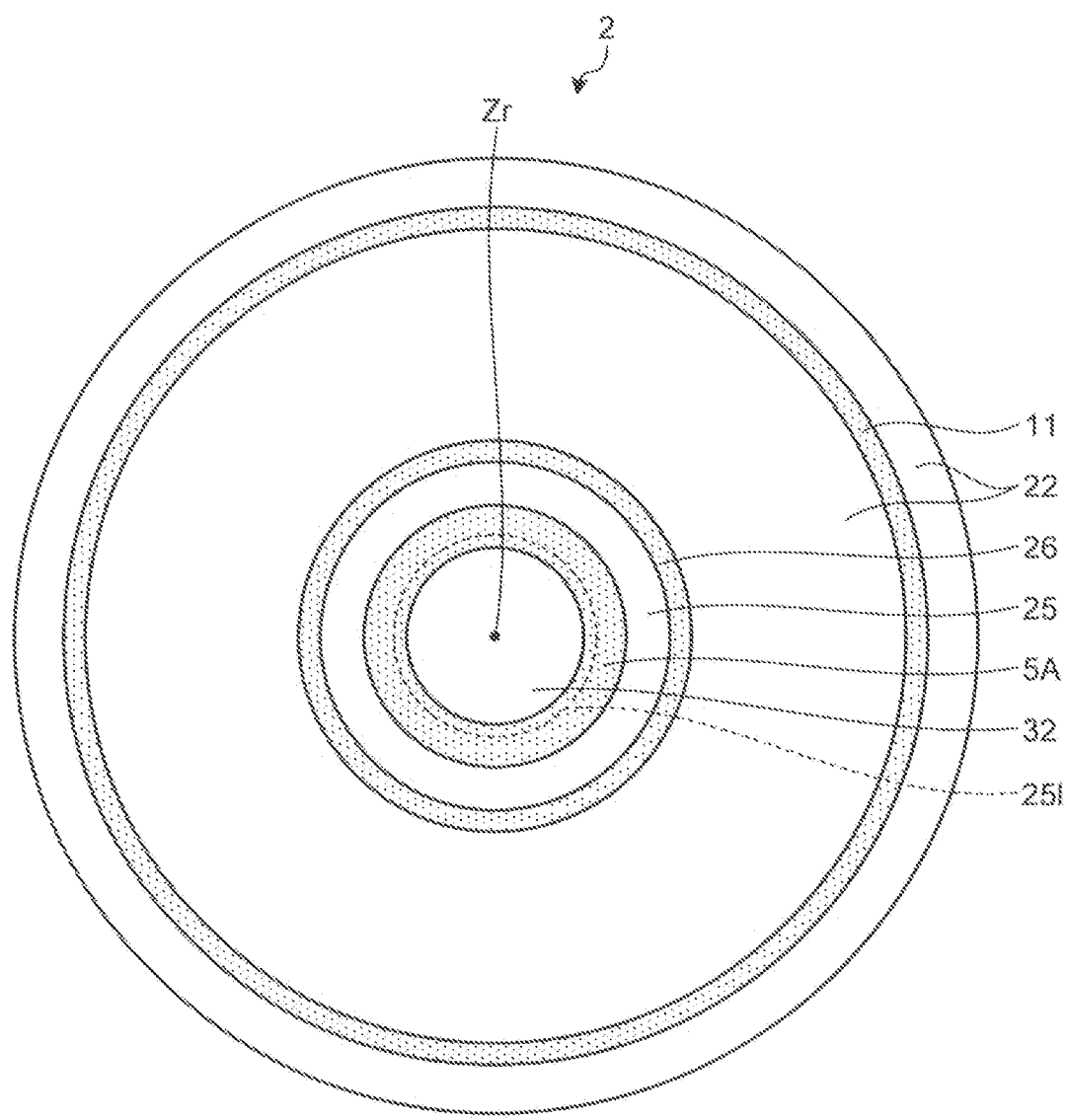
FIG. 10 is a view on arrow B-B of FIG. 9.
Figure 11:
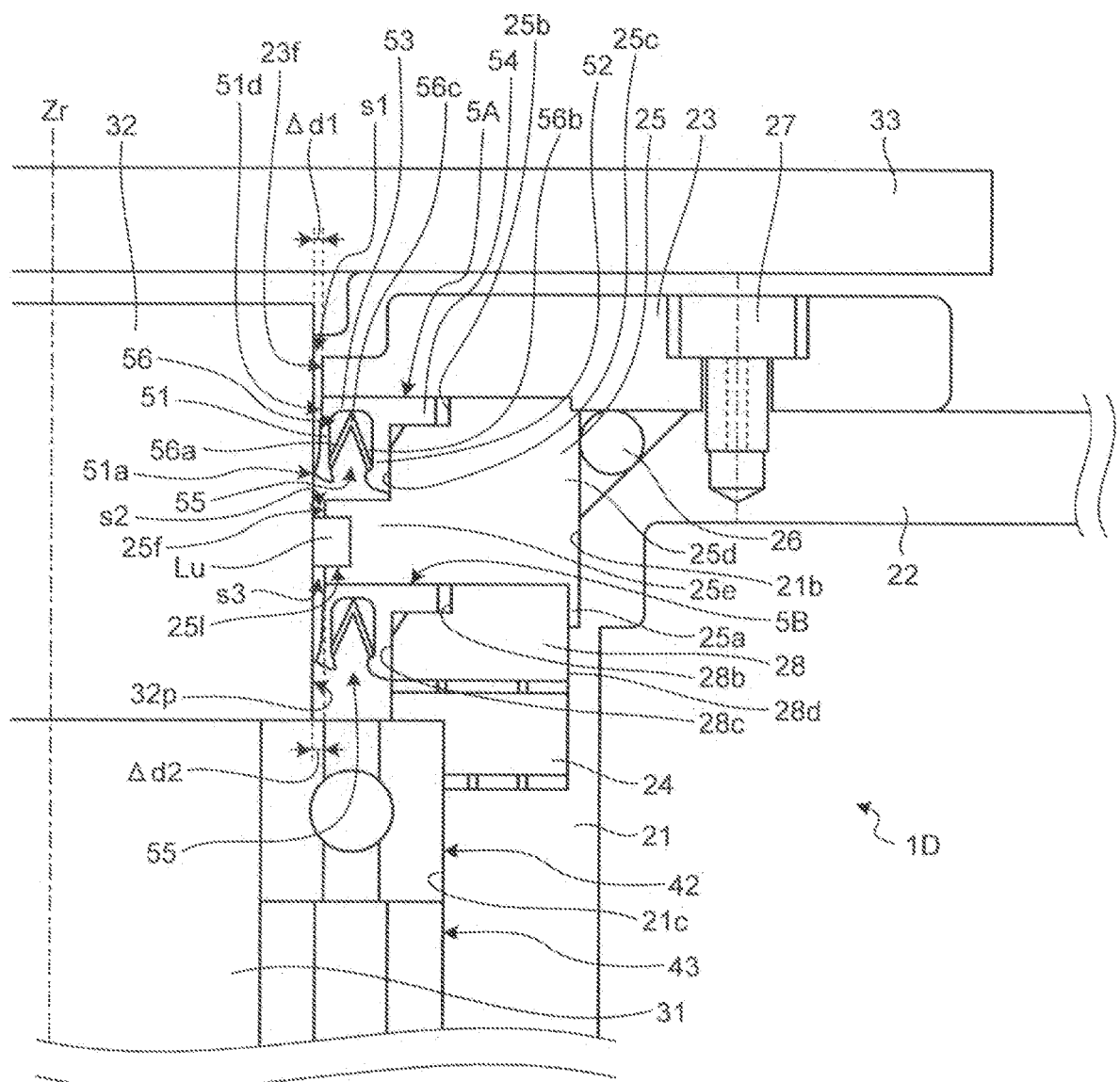
FIG. 11 is an enlarged view illustrating a gap of the sealing mechanism according to the second embodiment.

FIG. 8 is a cross-sectional view schematically illustrating a manufacturing device including a sealing mechanism according to a second embodiment. FIG. 9 is a cross-sectional view schematically illustrating the sealing mechanism according to the second embodiment. FIGS. 8 and 9 are the cross-section surfaces illustrating a sealing mechanism 1D taken along a plane including a rotational center axis Zr of the sealing mechanism 1D and parallel to the rotational center axis Zr. FIG. 10 is a view taken on arrow B-B of FIG. 9. FIG. 11 is an enlarged view illustrating a gap of the sealing mechanism according to the second embodiment. Components that are the same as above-described components will be denoted by the same reference signs, and a description therefor will be omitted.

The sealing mechanism 1D according to the second embodiment includes two annular sealing members 5A, 5B to seal a gap 55 at different positions in a direction along the rotational center axis Zr. In the second embodiment, the two annular sealing members 5A, 5B are disposed at the different positions, but these annular sealing members are the same components. For example, the two annular sealing members 5A, 5B are same as an annular sealing member 5 of a first embodiment. Note that the number of annular sealing members may be any number greater than 1 and may also be three or more.

A housing 2 according to the second embodiment includes a lid portion 23, an outer ring stopper member 24, a seal fixing spacer 25, and a seal fixing spacer 28. The lid portion 23 is fixed to a housing flange portion 22 with a bolt 27. The outer ring stopper member 24, the seal fixing spacer 25, and the seal fixing spacer 28 are disposed inside a barrel portion 21 of a housing body. The sealing mechanism 1D is disposed such that the through-hole is located along a vertical direction and an internal space V side of the through-hole is located on a vertically higher side. Therefore, an upper side of FIGS. 8 and 9 is a vertically higher side, and a lower side in FIGS. 8 and 9 is a vertically lower side.

The seal fixing spacer 25 determines a size of the gap 55 and further fixes the annular sealing member 5A. As illustrated in FIG. 10, the seal fixing spacer 25 is an annular member. Since the seal fixing spacer 25 functions as a guide of the annular sealing member 5A, an appropriate setting value can be set for a contact pressure of the annular sealing member 5A that contacts the rotary portion 32.

The seal fixing spacer 28 is an annular member, and determines the size of the gap 55 and further fixes the annular sealing member 5B. As illustrated in FIG. 9, the seal fixing spacer 28 includes a seal fixing recessed portion 28b, a radial inner peripheral portion 28c, and a radial outer peripheral portion 28d. At least a part of the radial outer peripheral portion 28d contacts an inner wall 21b of the through-hole of the barrel portion 21. Since the seal fixing spacer 28 functions as a guide of the annular sealing member 5B, an appropriate setting value can be set for a contact pressure of the annular sealing member 5B that contacts the rotary portion 32.

Further, in the housing flange portion 22, an annular groove 22a is formed concentrically with the rotational center axis Zr, and at least a part of the radial outer peripheral portion 25d constitutes a part of a wall surface of the annular groove 22a. When the lid portion 23 is fixed to the housing flange portion 22 with the bolt 27, an O-ring (second annular sealing member) 26 fitted into the annular groove 22a functions as a seal with improved sealing performance. Then, the O-ring (second annular sealing member) 26 is disposed at a position where a diameter thereof is larger than those of the annular sealing members 5A, 5B. Further, the spacer positioning portion 25a is sandwiched and fixed between the radial outer peripheral portion 28d of the above-described seal fixing spacer 28 and the inner wall 21b of the through-hole at the barrel portion 21. The annular groove 22a and the O-ring (second annular sealing member) 26 are not needed in the case where a vacuum level of the internal space V is low.

As illustrated in FIG. 10, the annular sealing member 5A is disposed so as to draw a concentric circle around the rotational center axis Zr in the same manner as a rotary portion 32, the seal fixing spacer 25, the O-ring (second annular sealing member) 26 fixed to the housing flange portion 22, and an O-ring 11. The annular sealing member 5B is also disposed so as to draw a concentric circle around the rotational center axis Zr in the same manner as the annular sealing member 5A. Further, as illustrated in FIG. 8, the annular sealing members 5A, 5B are disposed closer than the bearing 4 to the internal space V that is a low-pressure side space of the two spaces having different pressures. With this structure, the annular sealing members 5A, 5B prevent a lubricant and the like used in the bearing 4 from spattering on the internal space V side.

As illustrated in FIG. 11, when the lid portion 23 is fixed to the housing flange portion 22 with the bolt 27, the seal fixing spacer 25 sandwiches and fixes a seal flange portion 54 inserted into a seal fixing recessed portion 25b. By this, the annular sealing member 5A includes the seal flange portion 54. Therefore, the sealing mechanism 1D can reduce possibility that the annular sealing member 5A is rotated together with rotation of the rotary portion 32.

Further, as illustrated in FIG. 11, when the lid portion 23 is fixed to the housing flange portion 22 with the bolt 27, the seal fixing spacer 28 sandwiches and fixes the seal flange portion 54 inserted into the seal fixing recessed portion 28b. By this, the annular sealing member 5B includes the seal flange portion 54. Therefore, the sealing mechanism 1D can reduce possibility that the annular sealing member 5B is rotated together with rotation of the rotary portion 32.

Since the rotary portion 32 is rotated in a state that the annular sealing members 5A, 5B are fixed to the housing 2, friction is caused between the annular sealing members 5A, 5B and the rotary portion 32. Heat generation caused by this friction may accelerate abrasion of the annular sealing members 5A, 5B or the rotary portion 32. Therefore, reducing such friction is desired. Considering this, the sealing mechanism 1D includes a lubricant groove 25l that stores a lubricant Lu to be supplied between the annular sealing members 5A, 5B and a radial outer surface 32p of the rotary portion 32.

The seal fixing spacer 25 includes a radial inner side surface 25f that faces the radial outer surface 32p of the rotary portion 32 at a position between the annular sealing members 5A, 5B. The radial inner side surface 25f is located on the vertically higher side than a position of the annular sealing member 5B. The lubricant groove 25*l* is a recessed portion provided at the radial inner side surface 25*f* of the seal fixing spacer 25. The lubricant groove 25*l* is formed in an annular shape as indicated by a dotted line in FIG. 10. The lubricant Lu stored in the lubricant groove 25*l* is, for example, grease. For example, the lubricant Lu partly spreads out of the lubricant groove 25*l* and contacts the radial outer surface 32*p* due to surface tension. By this, the lubricant Lu is held by the lubricant groove 25*l* and the radial outer surface 32*p*. Further, since the lubricant Lu has flowability, the lubricant is stably supplied between the annular sealing member 5B and the radial outer surface 32*p* of the rotary portion 32 from the lubricant groove 25*l* by gravity. This easily keeps a state that the lubricant Lu is present between the radial outer surface 32*p* of the rotary portion 32 and the annular sealing member 5B. Further, the lubricant Lu is supplied to the annular sealing member 5A by a pressure caused by slight air leakage between the rotary portion 32 and the annular sealing member 5B. Furthermore, the lubricant Lu is also supplied to the annular sealing member 5A at the time of pressure change in the internal space V (start-up time and stop time of a manufacturing device 100). Therefore, abrasion of the annular sealing members 5A, 5B or the rotary portion 32 is suppressed. Therefore, the sealing mechanism 1D can reduce frequency of replacing a component that improves sealing performance.

Further, the annular sealing member 5A out of the annular sealing members 5A, 5B is located closer than the lubricant groove 25*l* to the low pressure side. By this, the lubricant Lu that has been transferred to the annular sealing member 5A side from the lubricant groove 25*l* is prevented from being transferred to the internal space V by the annular sealing member 5A. Therefore, the sealing mechanism 1D can reduce possibility of spattering, to the internal space V, the lubricant Lu to be supplied to a surface of a contact type seal.

Further, surfaces of the annular sealing members 5A, 5B and the rotary portion 32 have a certain level of surface roughness including fine unevenness. Therefore, sealing performance at a portion where the annular sealing members 5A, 5B contact the rotary portion 32 may depend on the level of surface roughness. In the second embodiment, since the lubricant Lu is supplied to the surfaces of annular sealing members 5A, 5B and the rotary portion 32, the lubricant Lu is filled into recessed portions included in the surface roughness. Therefore, in the sealing mechanism 1D, the surface roughness of the annular sealing members 5A, 5B and the rotary portion 32 is improved by the lubricant Lu, and sealing performance can be improved.

The lid portion 23 can adjust a vacuum level by appropriately setting a distance Δd1 of a gap s1 between a radial inner side surface 23*f* and the radial outer surface 32*p*. Preferably, the distance Δd1 is 0.001 mm or more and 0.5 mm or less, for example.

The lubricant groove 25*l* is provided at a part of the radial inner side surface 25*f* as illustrated in FIG. 11. The seal fixing spacer 25 can adjust a vacuum level by suitably setting a distance Δd2 of a gap s2 between the radial outer surface 32*p* and a portion in the radial inner side surface 25*f*, the portion being located closer than the lubricant groove 25*l* to the annular sealing member 5A side. Further, the seal fixing spacer 25 can adjust a vacuum level by suitably setting the distance Δd2 of a gap s3 between the radial outer surface 32*p* and a portion in the radial inner side surface 25*f*, the portion being located closer than the lubricant groove 25*l* to the annular sealing member 5B side. Preferably, the distance Δd2 is 0.001 mm or more and 0.5 mm or less, for example. Further, the distance Δd2 is smaller than the size of the gap 55. This makes the lubricant Lu gradually pass through the gaps s2, s3 between the radial inner side surface 25*f* and the radial outer surface 32*p*. Therefore, it is possible to suppress a situation that a large amount of the lubricant Lu is supplied to the annular sealing members 5A, 5B sides. Note that the gaps s2, s3 in the second embodiment are the gaps having the same distance Δd2, but may also be the gaps having different distances.

In the annular sealing members 5A, 5B, a lip portion 51 has a pressure caused by elastic deformation of the lip portion 51 and receives a pressure applied to a biasing member 56, thus the lip portion 51 contacts the radial outer surface 32*p* of the rotary portion 32. Therefore, the sealing mechanism 1D can increase a contact pressure of the lip portion 51 to the radial outer surface 32*p* of the rotary portion 32. Further, the space surrounded by a fixing portion 52, an annular connecting unit 53, and the lip portion 51 is opened to an external space E that is a high-pressure side space of the two spaces having the different pressures. Therefore, a pressure difference between the two spaces having different pressures can increase the contact pressure of the lip portion 51 that contacts the radial outer surface 32*p* of the rotary portion 32. This enables the sealing mechanism 1D to keep high sealing performance even when the internal space V is highly vacuumed. Further, not only an inner peripheral side end 51*a* of the lip portion 51 contacts the radial outer surface 32*p* but also at least a part of an inner peripheral side base portion 51*d* of the lip portion 51 close to the annular connecting unit 53 contacts the radial outer surface 32*p*. As a result, the sealing performance can be secured because the inner peripheral side of the lip portion 51 comes into surface contact with the radial outer surface 32*p*.

Even when abrasion or deformation is caused at the lip portion 51 or the shaft 31, the biasing member 56 functions so as to secure the contact pressure. Therefore, the sealing mechanism 1D can reduce frequency of replacing the annular sealing members 5A, 5B or the rotary portion 32 serving as components that improve sealing performance.

The space surrounded by the lip portion 51, annular connecting unit 53, and fixing portion 52 is opened to the external space E on the high pressure side of the two spaces that are the internal space V and the external space E having the different pressures. With this structure, the pressure caused by own elastic deformation of the lip portions 51 of the annular sealing members 5A, 5B and the pressure applied by the biasing member 56 synergistically work, and the contact pressures of the annular sealing member 5A, 5B that contact the rotary portion 32 can be increased.

The through-hole of the barrel portion 21 is arranged along the vertical direction in the sealing mechanism 1D, but the through-hole may also be arranged along a horizontal direction. In the case of this arrangement, there is a portion where the lubricant groove 25*l* is located on the vertically higher side than the rotary portion 32. Therefore, the lubricant Lu is supplied to the radial outer surface 32*p* of the rotary portion 32 by gravity. Then, the lubricant Lu passes along the radial outer surface 32*p*, and is supplied between the annular sealing members 5A, 5B and the rotary portion 32.

As described above, the sealing mechanism 1D can function as a separator between the two spaces that are the internal space V and the external space E having the different pressures. The sealing mechanism 1D includes the housing 2, the shaft 31 inserted into the housing 2, the bearing 4 provided at the housing 2 and supporting the shaft 31 in a rotatable manner, and the rotary portion 32. The rotary portion 32 is provided at one end portion of the shaft 31, rotated together with the shaft 31, and further having the radial outer surface 32$p$ facing the seal fixing spacer 25 of the housing 2 with the gap 55 having the predetermined size. Further, the sealing mechanism 1D includes the plurality of annular sealing members 5A, 5B to seal the gap 55 at the different positions, and the lubricant groove 25$l$ that stores the lubricant Lu to be supplied between the annular sealing members 5A, 5B and the radial outer surface 32$p$ of the rotary portion 32. The annular sealing member 5A that is one of the annular sealing members 5A, 5B is located closer than the lubricant groove 25$l$ to the low pressure side of the two spaces having the different pressures. By this, the lubricant Lu that has been transferred to the annular sealing member 5A side from the lubricant groove 25$l$ is prevented from being transferred to the internal space V by the annular sealing member 5A. Therefore, the sealing mechanism 1D can reduce possibility of spattering, to the internal space V, the lubricant Lu to be supplied to a surface of a contact type seal.

Further, in the sealing mechanism 1D, the housing 2 includes the seal fixing spacer 25 that determines the size of the gap 55 and further fixes the annular sealing member 5A. The radial inner side surface 25$f$ of the seal fixing spacer 25 is located between the annular sealing members 5A, 5B, and the lubricant groove 25$l$ is provided at the radial inner side surface 25$f$ of the seal fixing spacer 25. By this, the lubricant Lu is easily supplied to the surfaces of the plurality of annular sealing members 5A, 5B. Therefore, abrasion of the annular sealing members 5A, 5B or the rotary portion 32 is suppressed. Therefore, the sealing mechanism 1D can reduce frequency of replacing a component that improves sealing performance.

Further, in the sealing mechanism 1D, the lubricant groove 25$l$ is provided at a part of the radial inner side surface 25$f$ of the seal fixing spacer 25. Furthermore, the distances Δd2 between the radial outer surface 32$p$ of the rotary portion 32 and portions in the radial inner side surface 25$f$ of the seal fixing spacer 25 are smaller than the size of the gap 55, the portions being located closer than the lubricant groove 25$l$ to the annular sealing members 5A, 5B sides, respectively. This makes the lubricant Lu gradually pass through the gaps s2, s3 between the radial inner side surface 25$f$ and the radial outer surface 32$p$. Therefore, the sealing mechanism 1D can suppress the situation that a large amount of the lubricant Lu is supplied to the annular sealing members 5A, 5B sides.

First Modified Example of Second Embodiment

Figure 12:
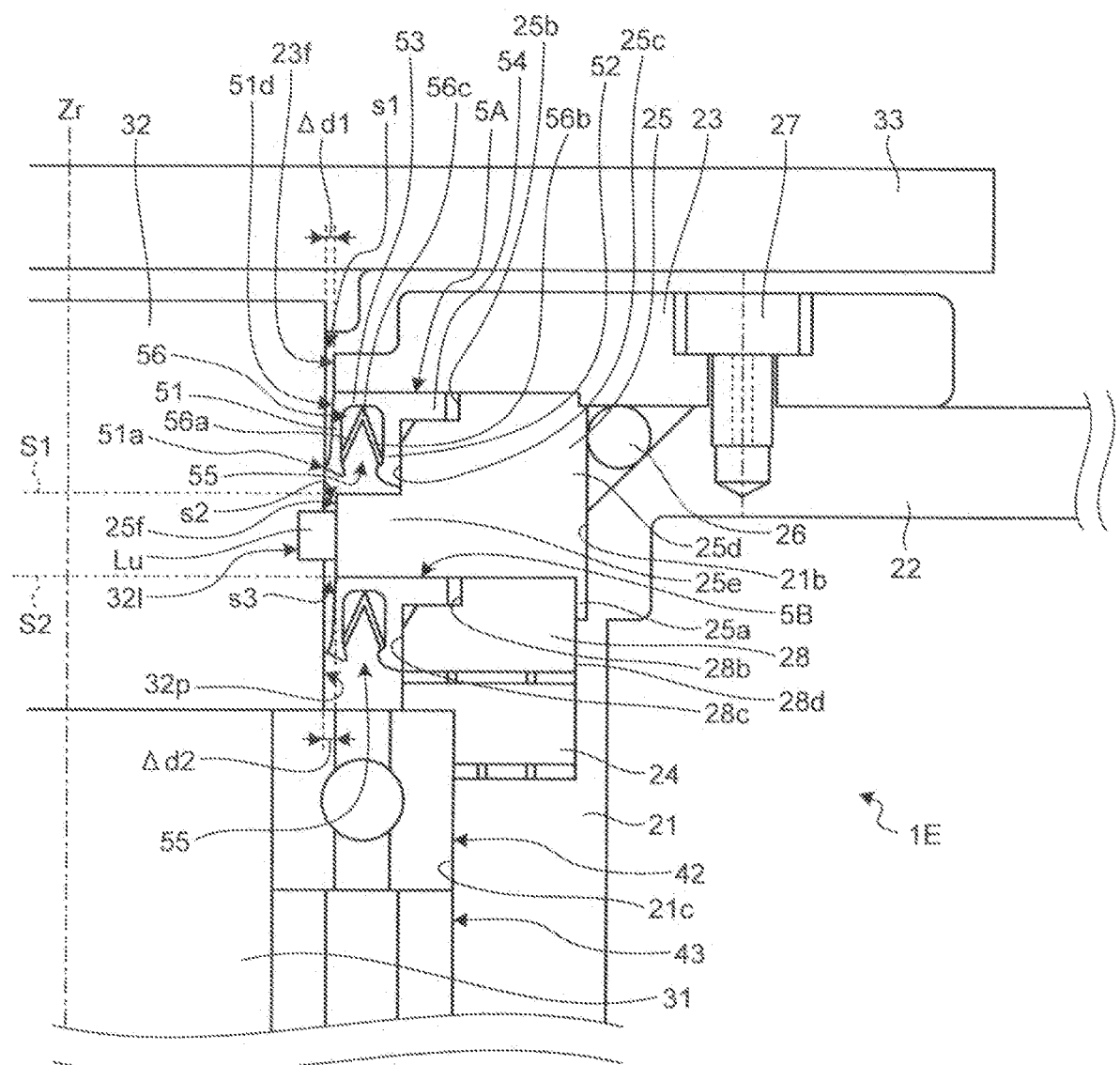
FIG. 12 is an enlarged view illustrating a gap of a sealing mechanism according to a first modified example of the second embodiment.

FIG. 12 is an enlarged view illustrating a gap of a sealing mechanism according to a first modified example of the second embodiment. Components that are the same as the above-described components will be denoted by the same reference signs, and a description therefor will be omitted. A sealing mechanism 1E according to the first modified example of the second embodiment includes a lubricant groove 321 that stores the lubricant Lu to be supplied between the annular sealing members 5A, 5B and the radial outer surface 32$p$ of the rotary portion 32.

The lubricant groove 321 is provided at a portion in the radial outer surface 32$p$ of the rotary portion 32, the portion facing the radial inner side surface 25$f$ of the seal fixing spacer 25. More specifically, as illustrated in FIG. 12, the lubricant groove 321 is provided in a portion of the radial outer surface 32$p$ of the rotary portion 32 sandwiched between a flat surface S1 and a flat surface S2. The flat surface S1 is vertical to the rotational center axis Zr and passes an end portion on the annular sealing member 5A side of the radial inner side surface 25$f$, and the flat surface S2 is vertical to the rotational center axis Zr and passes at an end portion on the annular sealing member 5B side of the radial inner side surface 25$f$. The lubricant groove 321 is provided in an annular shape around the rotational center axis Zr. For example, the lubricant Lu partly spreads out of the lubricant groove 321 and contacts the radial inner side surface 25$f$ of the seal fixing spacer 25 due to surface tension. By this, the lubricant Lu is held by the lubricant groove 321 and the radial inner side surface 25$f$. Further, since the lubricant Lu has flowability, the lubricant is stably supplied between the annular sealing member 5B and the radial outer surface 32$p$ of the rotary portion 32 from the lubricant groove 321 by gravity. This easily keeps a state that the lubricant Lu is present between the radial outer surface 32$p$ of the rotary portion 32 and the annular sealing member 5B. Further, the lubricant Lu is supplied to the annular sealing member 5A by a pressure caused by slight air leakage between the rotary portion 32 and the annular sealing member 5B. Furthermore, the lubricant Lu is also supplied to the annular sealing member 5A at the time of pressure change in the internal space V (start-up time and stop time of a manufacturing device 100). Therefore, abrasion of the annular sealing members 5A, 5B or the rotary portion 32 is suppressed. Therefore, the sealing mechanism 1E can reduce frequency of replacing a component that improves sealing performance.

Meanwhile, the lubricant groove 321 is at least located in the portion sandwiched between the flat surface S1 and the flat surface S2 out of the radial outer surface 32$p$ of the rotary portion 32, and is not necessarily provided in the annular shape around the rotational center axis Zr. The lubricant groove 321 may also be provided in an annular shape around a straight line that forms an angel relative to the rotational center axis Zr, for example.

As illustrated in FIG. 12, the lubricant groove 321 is provided at a part of the portion in the radial outer surface 32$p$ of the rotary portion 32, the portion facing the radial inner side surface 25$f$ of the seal fixing spacer 25. The seal fixing spacer 25 can adjust a vacuum level by suitably setting the distance Δd2 of the gap s2 between the radial inner side surface 25$f$ of the seal fixing spacer 25 and a portion in the radial outer surface 32$p$ of the rotary portion 32, the portion being located closer than the lubricant groove 321 to the annular sealing member 5A side. The seal fixing spacer 25 can adjust a vacuum level by suitably setting the distance Δd2 of the gap s3 between the radial inner side surface 25$f$ of the seal fixing spacer 25 and a portion in the radial outer surface 32$p$ of the rotary portion 32, the portion being located closer than the lubricant groove 321 to the annular sealing member 5B side. Preferably, the distance Δd2 is 0.001 mm or more and 0.5 mm or less, for example. Further, the distance Δd2 is smaller than the size of the gap 55. This makes the lubricant Lu gradually pass through the gaps s2, s3 between the radial inner side surface 25$f$ and the radial outer surface 32$p$. Therefore, it is possible to suppress a situation that a large amount of the lubricant Lu is supplied to the annular sealing members 5A, 5B sides. Note that the gaps s2, s3 in the first modified example of the second embodiment are the gaps having the same distance Δd2, but may also be the gaps having different distances.

Second Modified Example of Second Embodiment

Figure 13:
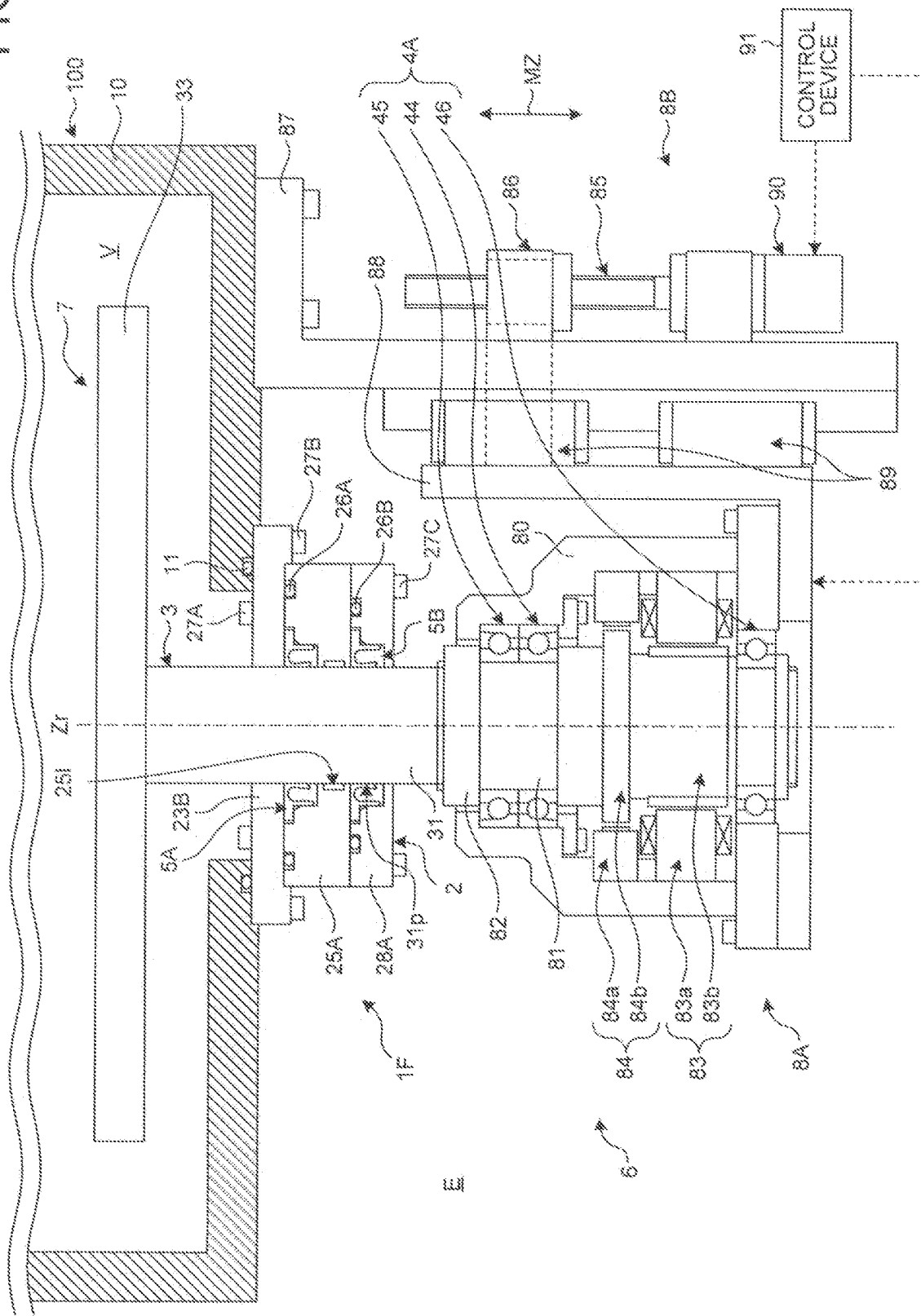
FIG. 13 is a cross-sectional view schematically illustrating a sealing mechanism according to a second modified example of the second embodiment.

FIG. 13 is a cross-sectional view schematically illustrating a sealing mechanism according to a second modified example of the second embodiment. A sealing mechanism 1F according to the second modified example of the second embodiment can function as a separator between the two spaces having different pressures in the same manner as the second embodiment and the first modified example of the second embodiment, but is different in that the shaft 31 can be linearly moved in the axial direction of the shaft 31 in addition to rotary movement. Components that are the same as the above-described components will be denoted by the same reference signs, and a description therefor will be omitted.

The housing 2 includes, as a housing body, a seal fixing spacer 28A, the seal fixing spacer 25A, and the lid portion 23B. The seal fixing spacer 28A, the seal fixing spacer 25A, and the lid portion 23B are stacked in the axial direction.

In the seal fixing spacer 28A according to the second modified example of the second embodiment, a portion overlapping with the seal fixing spacer 25A in a planar view is fixed with a fixing member 27C such as a bolt. The seal fixing spacer 28A includes an annular groove at the portion overlapping with the seal fixing spacer 25A in a planar view, and an O-ring (second annular sealing member) 26B is fitted into the annular groove to improve sealing performance between the seal fixing spacer 25A and the seal fixing spacer 28A. The seal fixing spacer 28A is fixed to the seal fixing spacer 25A with the fixing member 27C such as a bolt, and thus the O-ring (second annular sealing member) 26B fitted into the annular groove functions as a seal with improved sealing performance. Further, the seal fixing spacer 28A abuts on the other axial end of the seal fixing spacer 25A. Further, the O-ring (second annular sealing member) 26B is disposed at a position where a diameter thereof is larger than that of the annular sealing member 5B.

Third Modified Example of Second Embodiment

Figure 14:
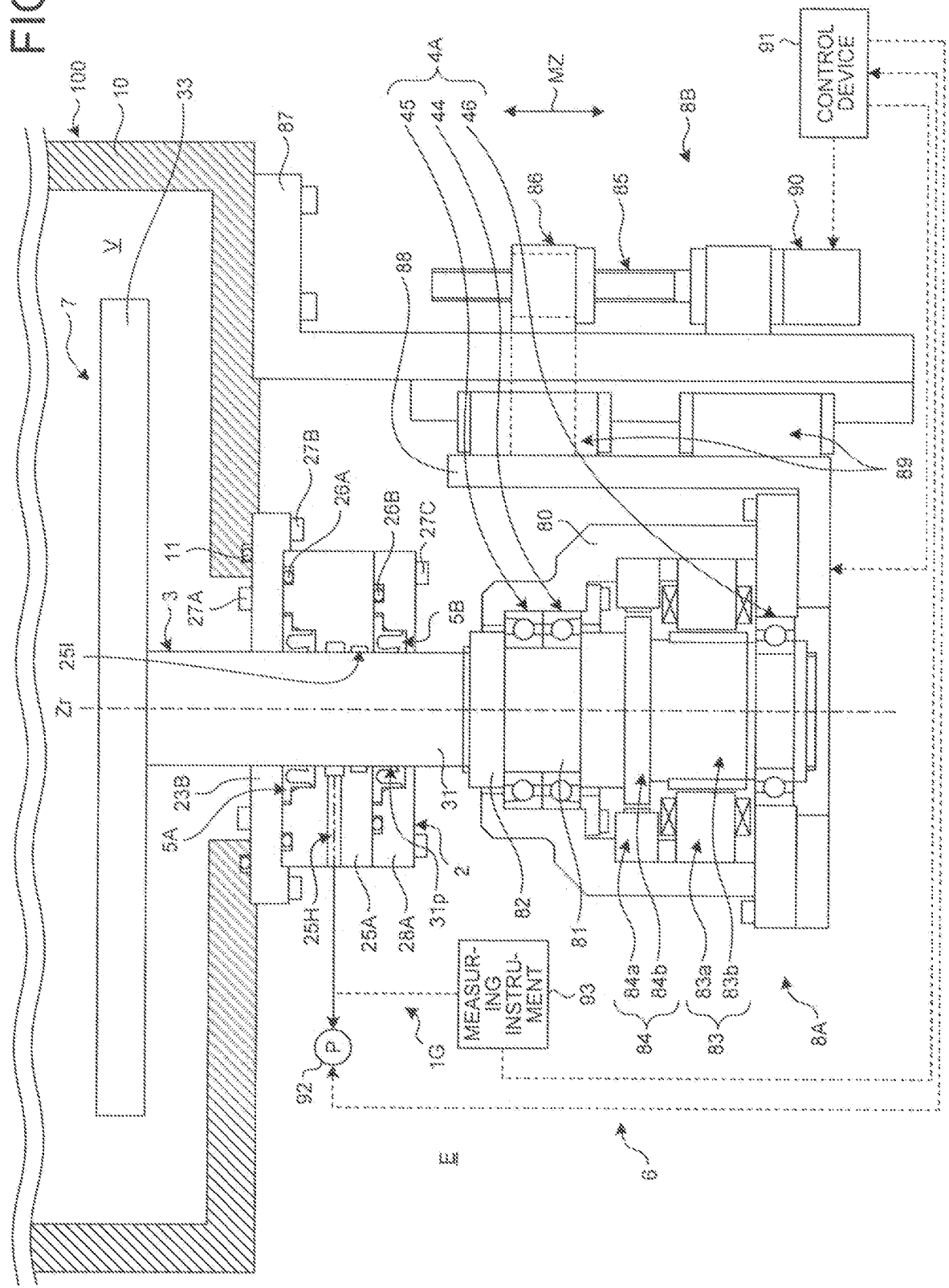
FIG. 14 is a cross-sectional view schematically illustrating a sealing mechanism according to a third modified example of the second embodiment.

FIG. 14 is a cross-sectional view schematically illustrating a sealing mechanism according to a third modified example of the second embodiment. Components that are the same as the above-described components will be denoted by the same reference signs, and a description therefor will be omitted.

A pressure in a space between the annular sealing member 5A and the annular sealing member 5B (hereinafter referred to as pressure between seals) is an intermediate pressure between the internal space V and the external space E of a frame body 10. Or, in the case where sealing performance of the annular sealing member 5A is lower than the annular sealing member 5B by putting priority on corrosion resistance performance, the pressure between the seals becomes close to the pressure in the internal space V of the frame body 10, for example, low vacuum.

The pressure between the seals changes in a manner of primary delay relative to a state change on the internal space V side of the frame body 10. Therefore, preferably, a period until the pressure between the seals is stabilized is secured as warm-up time. A sealing mechanism 1G according to the third modified example of the second embodiment includes a flow passage 25H in the housing 2, and the flow passage functions as an exhaust line connected to a space between the annular sealing member 5A and the annular sealing member 5B. The pressure between the seals becomes constant by exhausting a gas in the space between the annular sealing member 5A and the annular sealing member 5B via the flow passage 25H. As a result, the sealing mechanism 1G can shorten the warm-up time.

The sealing mechanism 1G further includes: a pump 92 as a pressure changing device; and a measuring instrument 93 to measure a pressure or a gas flow rate inside the flow passage 25H. A control device 91 may perform pressure control by controlling an exhaust amount of the gas of the pump 92 based on the measured pressure or gas flow rate inside the flow passage 25H so as to make the pressure between the seals constant. With this structure, the sealing mechanism 1G can shorten the warm-up time.

The sealing mechanism 1G records temporal change of the pressure or the gas flow rate inside the flow passage 25H measured by the control device 91. In the case where a measured value exceeds a threshold value, the sealing mechanism 1G can issue a warning to notify deterioration of the annular sealing members 5A or the annular sealing member 5B. As a result, replacement timing of the annular sealing members 5A or the annular sealing member 5B can be determined before serious influence is given to the internal space V of the frame body 10.

Fourth Modified Example of Second Embodiment

Figure 15:
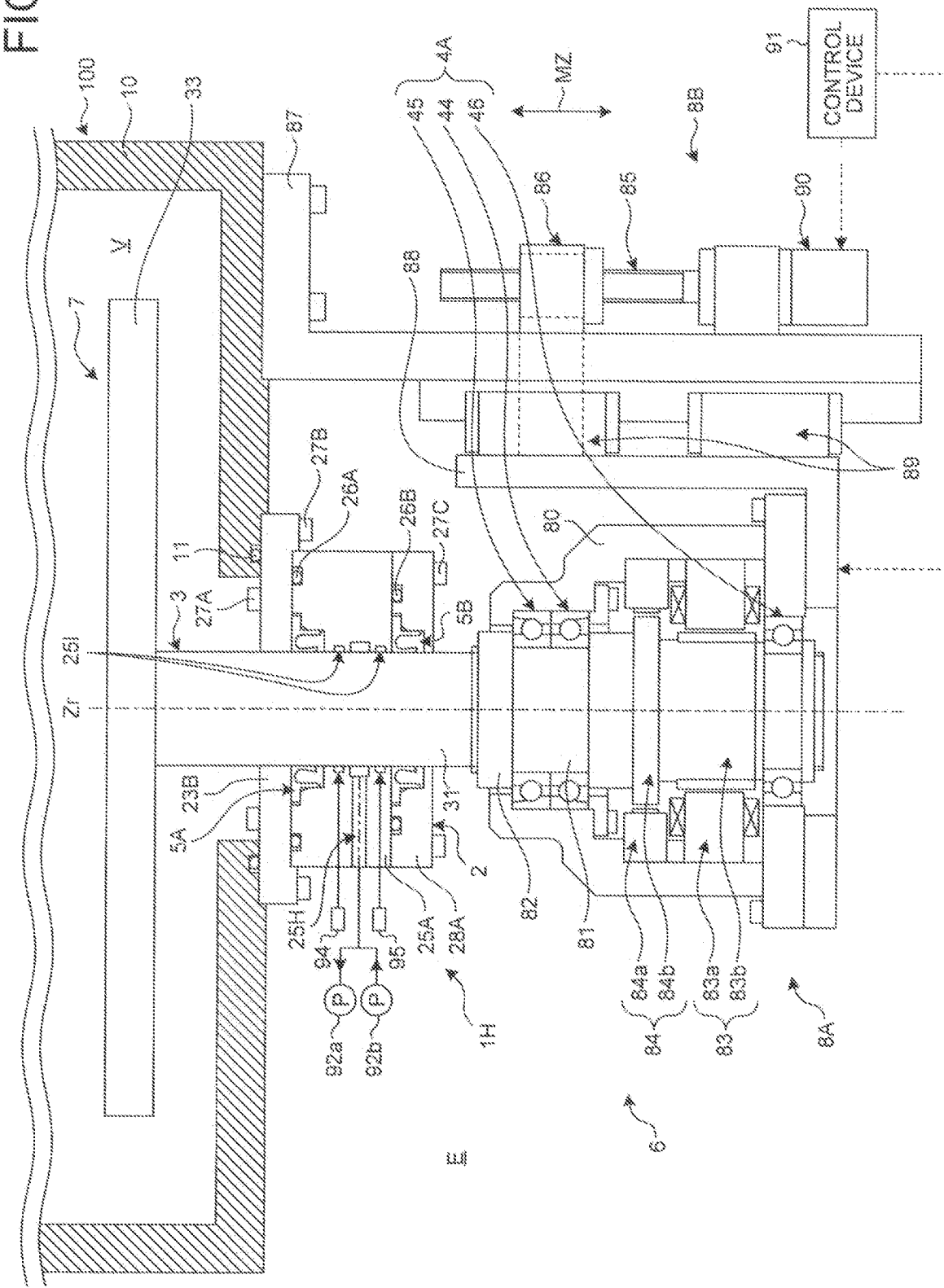
FIG. 15 is a cross-sectional view schematically illustrating a sealing mechanism according to a fourth modified example of the second embodiment.

FIG. 15 is a cross-sectional view illustrating a sealing mechanism according to a fourth modified example of the second embodiment. Components that are the same as the above-described components will be denoted by the same reference signs, and a description therefor will be omitted.

In a sealing mechanism 1H, lubricant grooves 25*l* are disposed at both sides of the flow passage 25H respectively. More specifically, the flow passage 25H is disposed between the two lubricant grooves 25*l*. The flow passage 25H functions as an exhaust line or a supply line.

The sealing mechanism 1H includes an exhaust pump 92*a* and a supply pump 92*b* as pressure change devices. When the exhaust pump 92*a* is operated out of the exhaust pump 92*a* and the supply pump 92*b*, a gas in the space between the annular sealing member 5A and the annular sealing member 5B is exhausted via the flow passage 25H, thereby making the pressure between the seals constant. As a result, the sealing mechanism 1H can shorten the warm-up time. When the supply pump 92*b* is operated out of the exhaust pump 92*a* and the supply pump 92*b*, the pressure in the space between the annular sealing member 5A and the annular sealing member 5B is increased, thereby supplying the lubricant in the lubricant groove 25*l* to the annular sealing member 5A and the annular sealing member 5B. In the sealing mechanism 1H, the lubricant can be supplied to the annular sealing member 5A and the annular sealing member 5B in a purposeful manner. For example, even in the case where a stroke of the shaft 31 is short, the lubricant is easily supplied to the annular sealing member 5A and the annular sealing member 5B in the sealing mechanism 1H.

Further, preferably, the sealing mechanism 1H includes a lubricant supply unit 94 and a lubricant supply unit 95. The lubricant supply unit 94 and the lubricant supply unit 95 can supply the lubricant to the lubricant groove 25*l* via a flow passage or the like provided at the housing 2, for example. This enables the sealing mechanism 1H to easily supply the lubricant to the lubricant groove 25*l* even in the case where the lubricant stored in the lubricant groove 25*l* is decreased.

Third Embodiment

Figure 16:
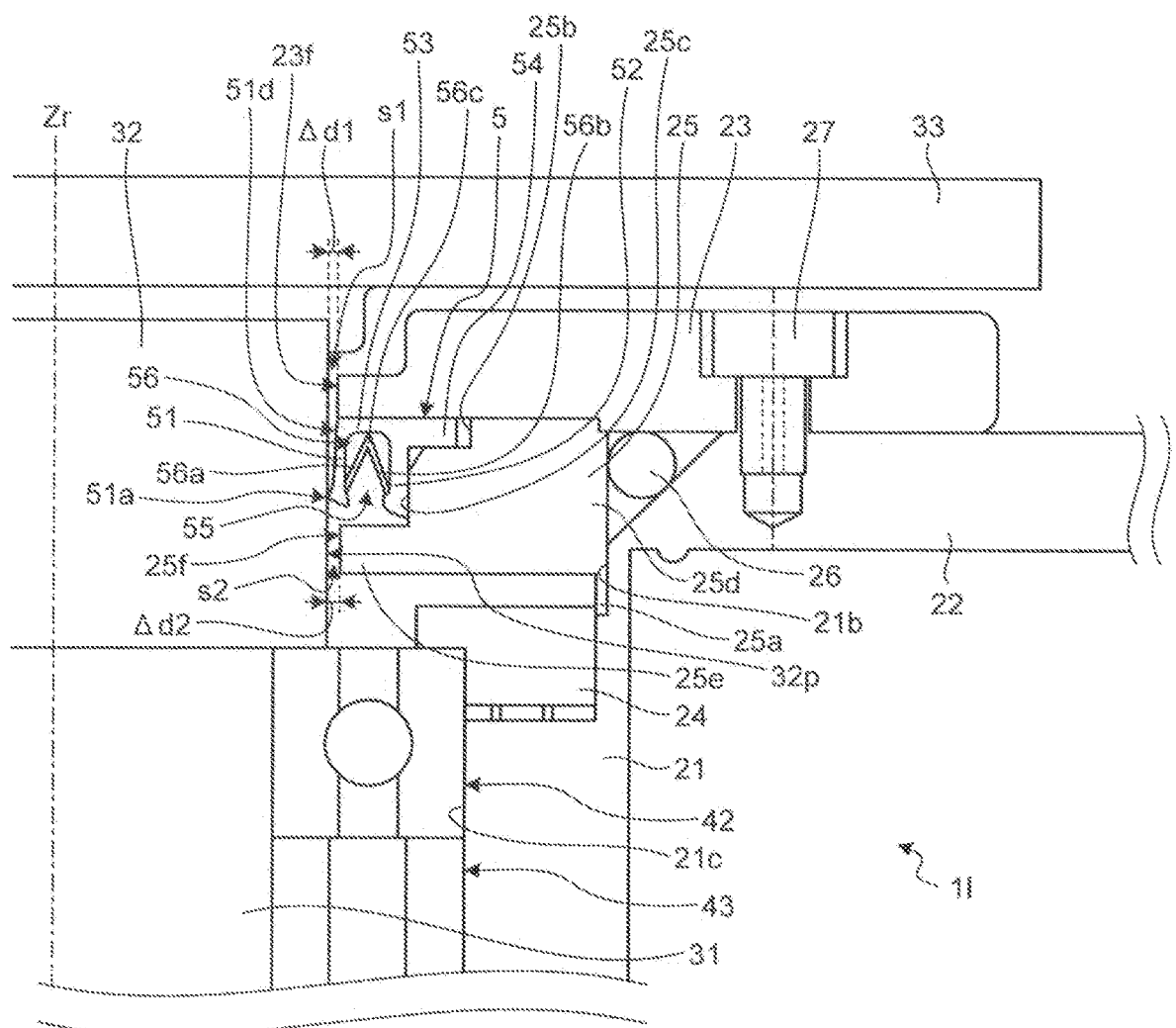
FIG. 16 is an enlarged view illustrating a gap of a sealing mechanism according to a third embodiment.

FIG. 16 is an enlarged view illustrating a gap of a sealing mechanism according to a third embodiment. Components that are the same as the above-described components will be denoted by the same reference signs, and a description therefor will be omitted. A sealing mechanism 1I according to the third embodiment is an example in which an annular sealing member 5 is provided but a lubricant groove is not provided at a housing 2.

First Modified Example of Third Embodiment

Figure 17:
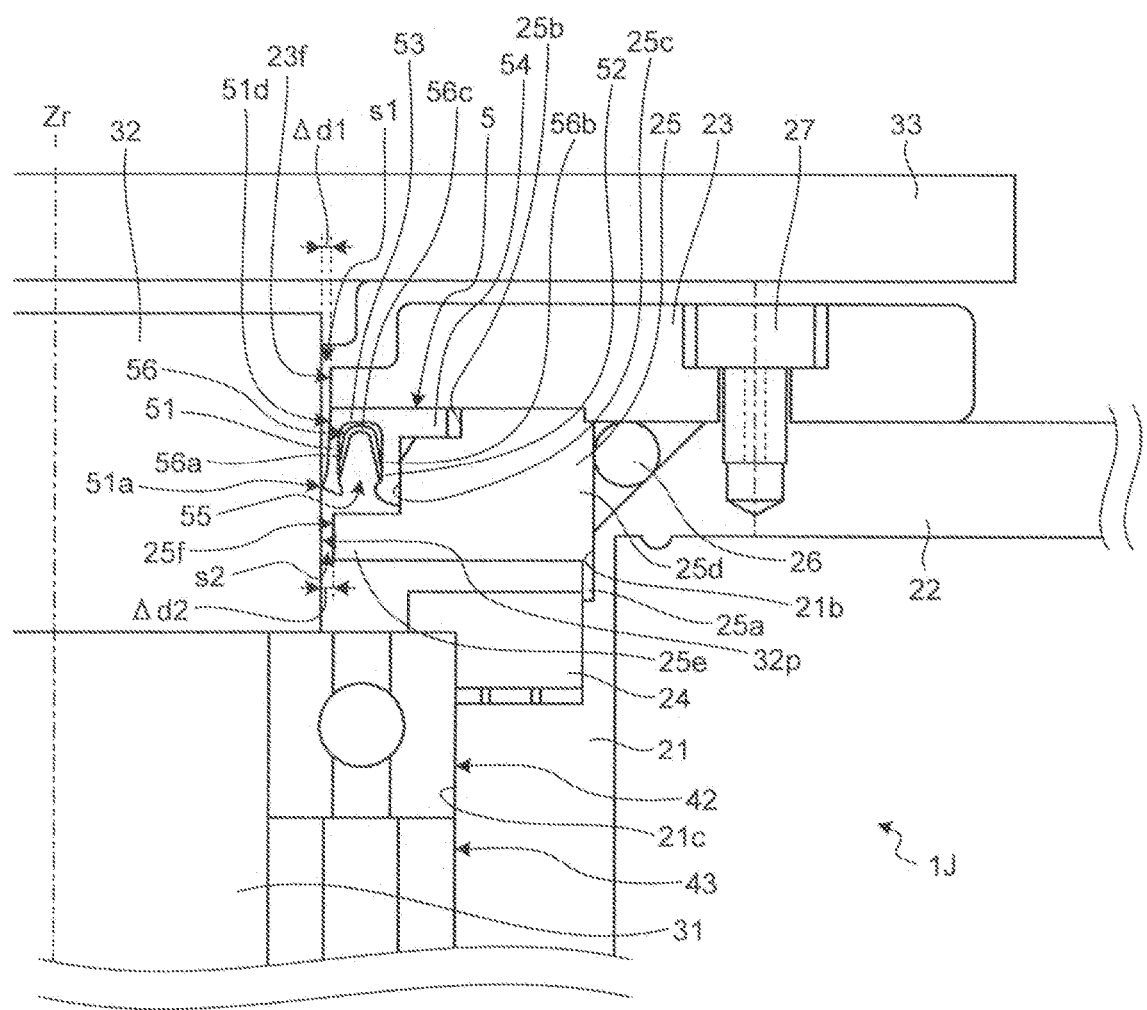
FIG. 17 is an enlarged view illustrating a gap of a sealing mechanism according to a first modified example of the third embodiment.

FIG. 17 is an enlarged view illustrating a gap of a sealing mechanism according to a first modified example of the third embodiment. Components that are the same as the above-described components will be denoted by the same reference signs, and a description therefor will be omitted. As illustrated in FIG. 17, in a sealing mechanism 1J according to the first modified example of the third embodiment, a biasing member 56 is, for example, made of stainless steel or the like and in all cases, the biasing member is an elastic body formed in a U-shape in a cross-sectional view obtained by bending, at a bending portion 56c, a plate-like portion 56a and a plate-like portion 56b which are flat plates. In the sealing mechanism 1J, the bending portion 56c is bent so as to have a predetermined curvature. Further, the biasing member 56 performs biasing such that ends of the plate-like portion 56a and plate-like portion 56b are mutually outstretched.

Second Modified Example of Third Embodiment

Figure 18:
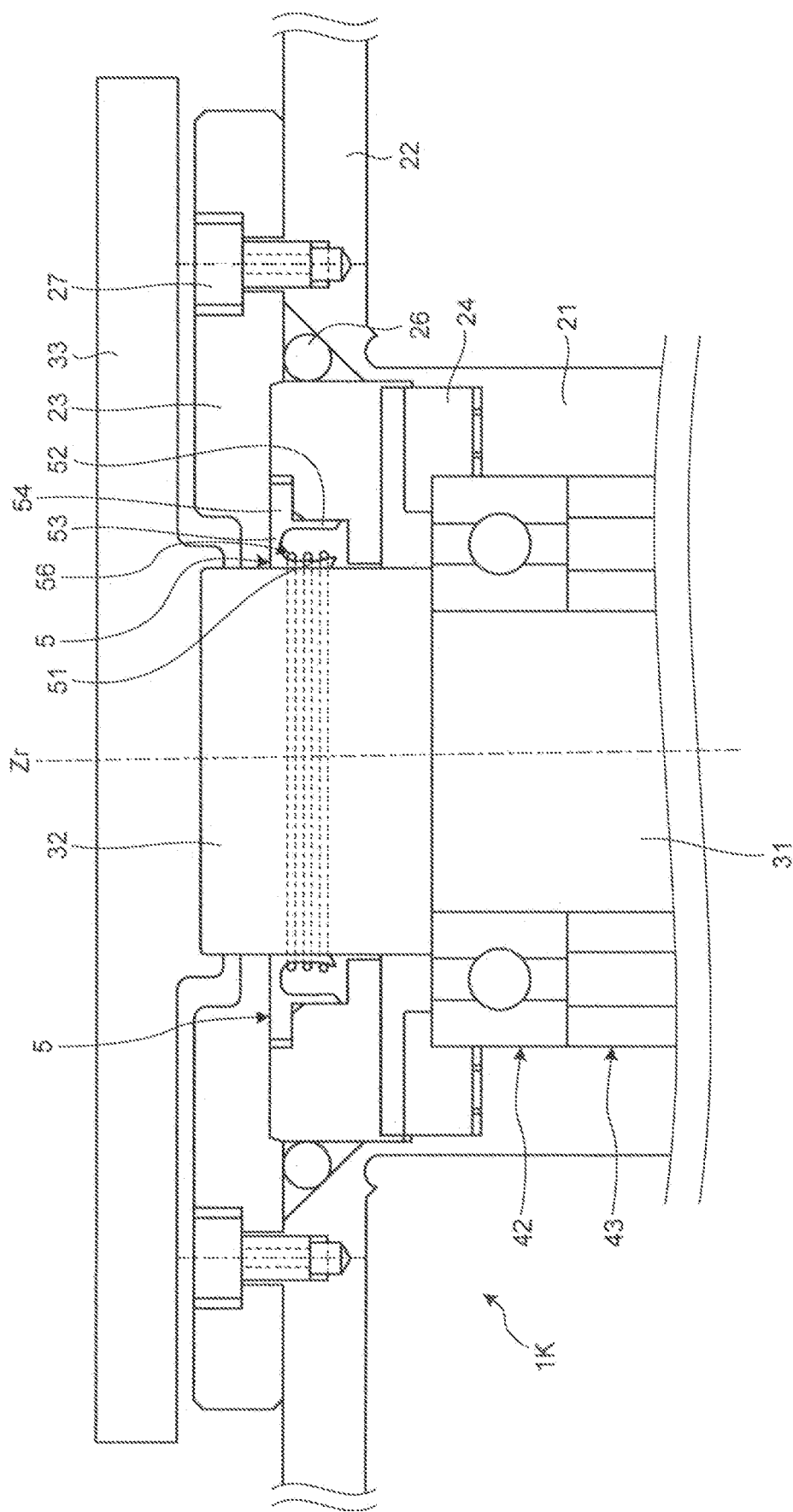
FIG. 18 is an enlarged view illustrating a gap of a sealing mechanism according to a second modified example of the third embodiment.

FIG. 18 is an enlarged view illustrating a gap of a sealing mechanism according to a second modified example of the third embodiment. Components that are the same as the above-described components will be denoted by the same reference signs, and a description therefor will be omitted. As illustrated in FIG. 18, in a sealing mechanism 1K according to the second modified example of the third embodiment, the biasing member 56 is a linear member of stainless steel and, for example, is wound around as a coil spring in a cylindrical spiral form. As illustrated in FIG. 18, the biasing member 56 is disposed inside a space surrounded by a fixing portion 52, an annular connecting unit 53, and a lip portion 51 and located on a radial outer side of a lip portion 51. Further, a diameter determined by a rotary portion 32 and the lip portion 51 is set larger than a diameter of the coil spring of the biasing member 56. By this, the biasing member 56 can bias pressing force of the lip portion 51 toward the rotary portion 32 side.

Third Modified Example of Third Embodiment

Figure 19:
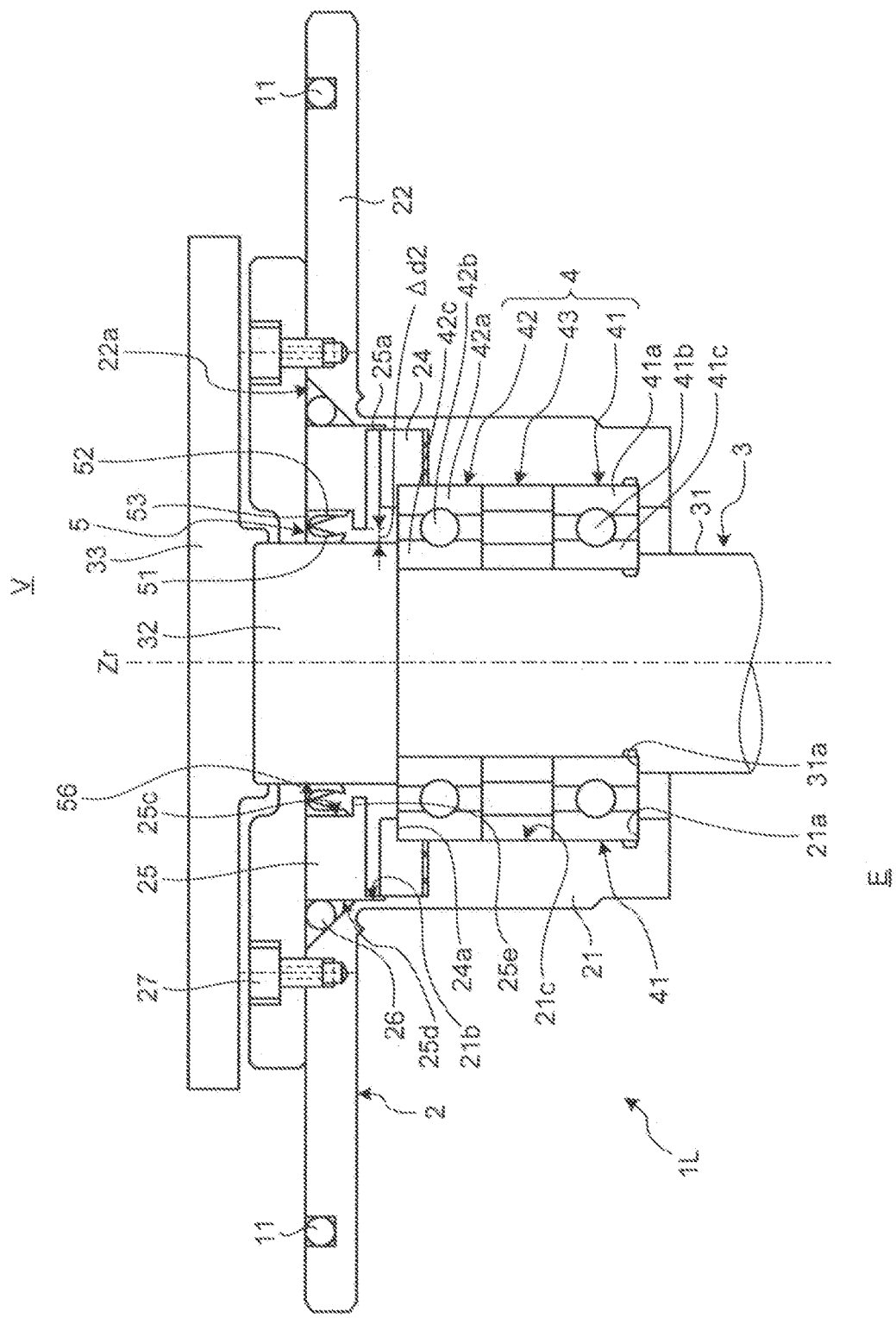
FIG. 19 is a cross-sectional view schematically illustrating a sealing mechanism according to a third modified example of the third embodiment.

FIG. 19 is a cross-sectional view illustrating a sealing mechanism according to a third modified example of the third embodiment. In a sealing mechanism 1L according to the third modified example of the third embodiment, the annular sealing member 5 does not include a seal flange portion 54. Therefore, a seal fixing recessed portion 25b is not also provided in a seal fixing spacer 25.

In the sealing mechanism 1L, the annular sealing member 5 is fixed by repellent force generated between the seal fixing spacer 25 and the rotary portion 32. Co-rotation is more suppressed in the sealing mechanism 1I according to the third embodiment than the sealing mechanism 1L according to the third modified example of the third embodiment. Therefore, sealing performance can be secured even when a rotation speed of a rotary member 3 is accelerated. Therefore, the sealing mechanism 1I according to the third embodiment can keep an internal space V having a higher vacuum level than the sealing mechanism 1L according to the third modified example of the third embodiment. On the other hand, depending on the rotation speed of the rotary member 3, the sealing mechanism 1L according to the third modified example of the third embodiment can also be used. In the sealing mechanism 1L according to the third modified example of the third embodiment, since the annular sealing member 5 and the seal fixing spacer 25 each have a simple shape, a processing load is reduced and cost can be reduced.

Fourth Modified Example of Third Embodiment

Figure 20:
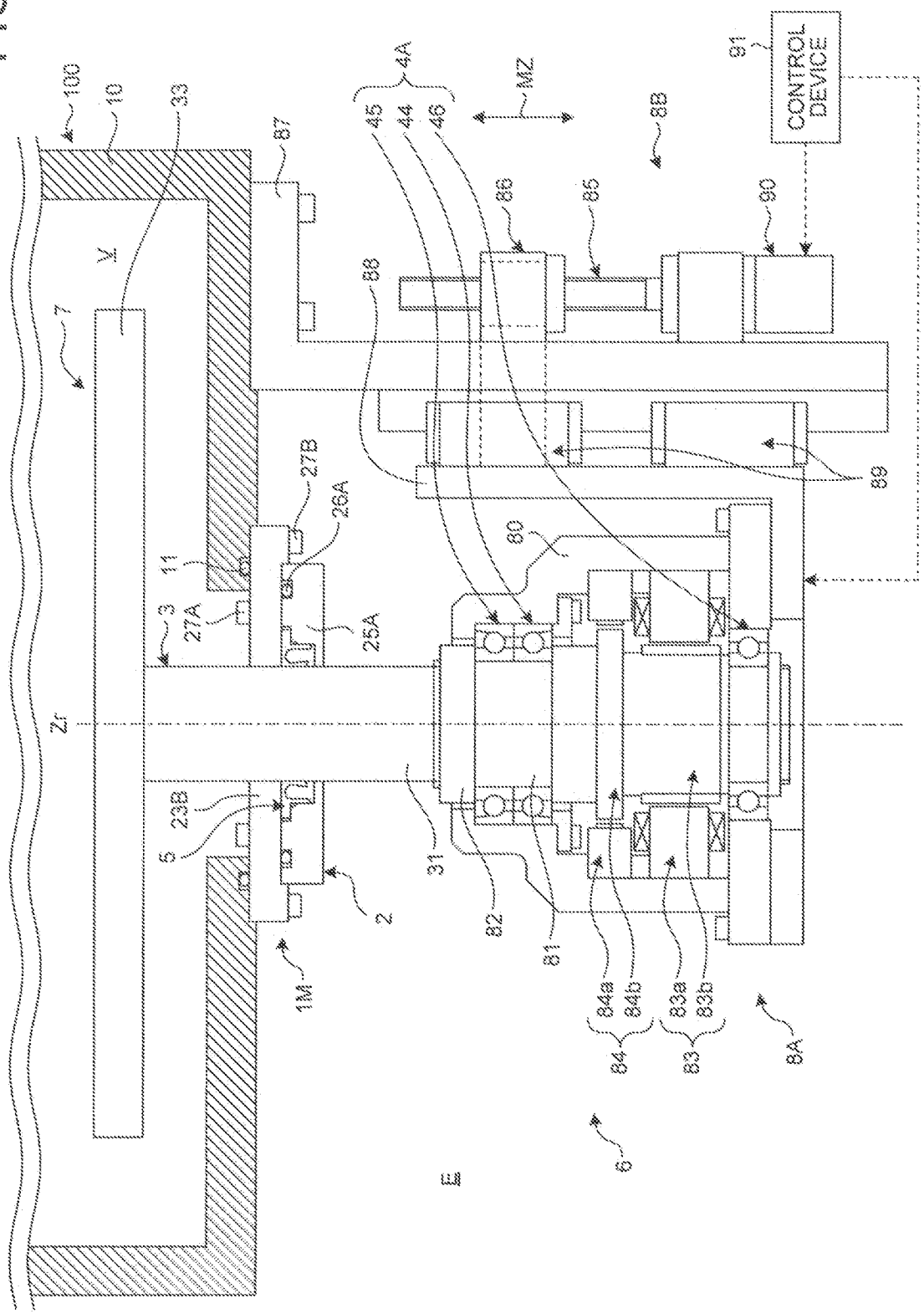
FIG. 20 is a cross-sectional view schematically illustrating a sealing mechanism according to a fourth modified example of the third embodiment.

FIG. 20 is a cross-sectional view illustrating a sealing mechanism according to a fourth modified example of the third embodiment. A sealing mechanism 1M according to the fourth modified example of the third embodiment can function as a separator between two spaces having different pressures in the same manner as the third embodiment and the first to third modified examples of the third embodiment, but is different in that a shaft 31 can be linearly moved in the axial direction of the shaft 31 in addition to rotary movement. Components that are the same as the above-described components will be denoted by the same reference signs, and a description therefor will be omitted.

Fifth Modified Example of Third Embodiment

Figure 21:
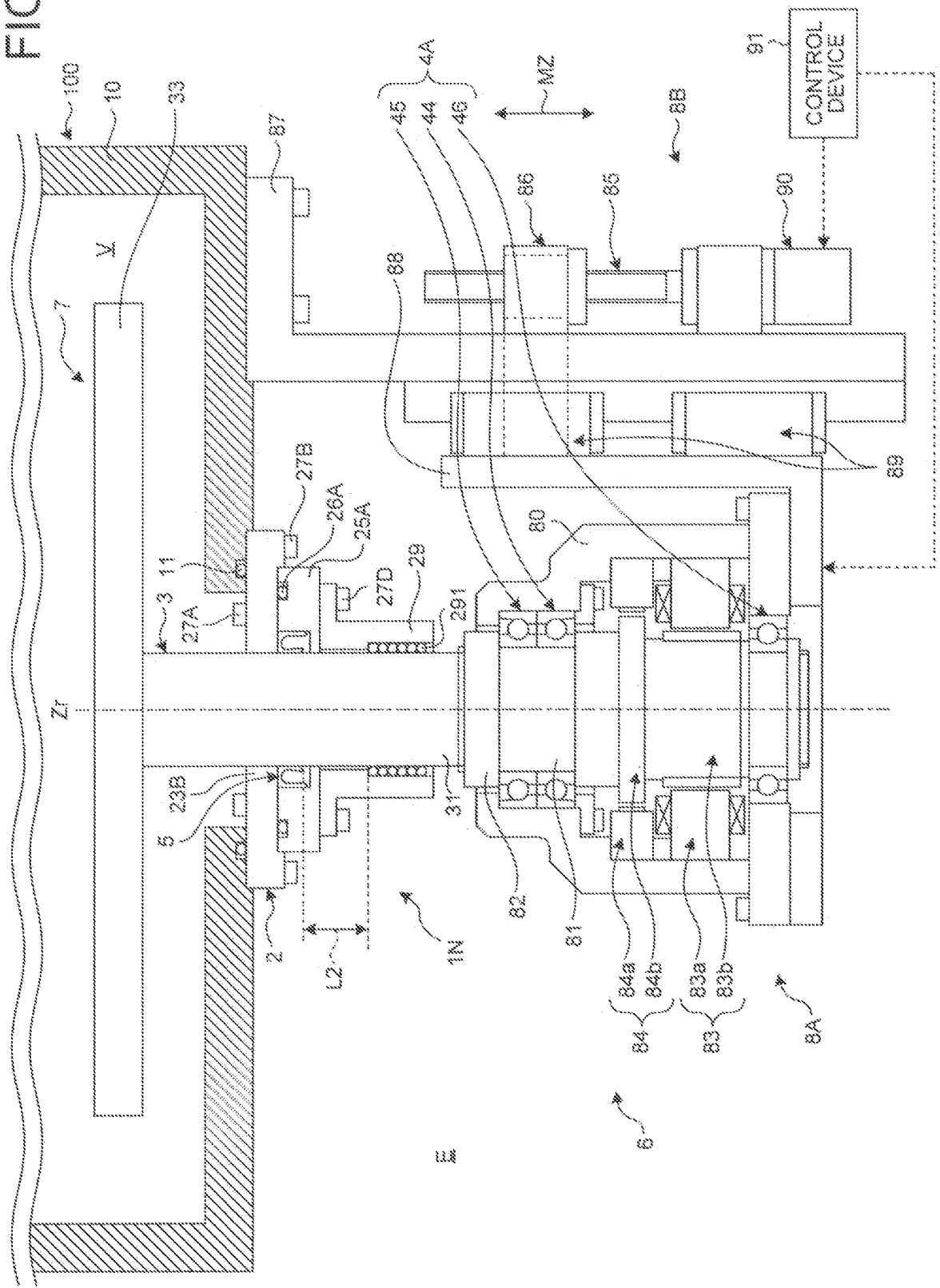
FIG. 21 is a cross-sectional view schematically illustrating a sealing mechanism according to a fifth modified example of the third embodiment.

FIG. 21 is a cross-sectional view illustrating a sealing mechanism according to a fifth modified example of the third embodiment. A sealing mechanism 1N according to the fifth modified example of the third embodiment differs from the fourth modified example of the third embodiment in including a guide member 29. Components that are the same as the above-described components will be denoted by the same reference signs, and a description therefor will be omitted.

The guide member 29 is a cylindrical member and fixed to a seal fixing spacer 25A with a fixing member 27D such as a bolt. The guide member 29 includes, on an inner wall thereof, a bearing 291 that is, for example, a linearly-moving ball bearing. The bearing 291 is provided with a lubricant. Since the bearing 291 contacts the shaft 31, the guide member 29 can guide the shaft 31. Preferably, a length L2 from a surface on the internal space V side of the bearing 291 to the annular sealing member 5 is equal to or larger than a stroke that is a maximum length allowed by linear movement of the shaft 31. This suppresses mixture of a lubricant of the annular sealing member 5 with the lubricant of the bearing 291. For example, in the case where the lubricant of the annular sealing member 5 and the lubricant of the bearing 291 are different materials, the lubricants may be deteriorated when both lubricants are mixed. Therefore, the sealing mechanism 1N can suppress deterioration of the lubricants.

Meanwhile, the annular sealing member 5 of the sealing mechanism 1N is not provided with the seal flange portion 54 in the same manner as the sealing mechanism 1L according to third modified example of the third embodiment. In the case where the number of rotation allowable by the bearing 291 is set to a small number, more specifically, in the case where the number of rotation of the rotary member 3 is low, preferably, the seal flange portion 54 is not provided in view of the points that reduction of the processing load and cost reduction can be achieved. Note that the annular sealing member 5 of the sealing mechanism 1N may include the seal flange portion 54.

While the first to third embodiments have been described above, the first to third embodiments are not limited by the matters described above. Further, at least one of various kinds of omission, replacement, and modifications can be made in respect to the components in a range without departing from the gist of the first to third embodiments.

The invention claimed is:

1. A sealing mechanism functioning as a separator between two spaces having different pressures, comprising:
   a housing;
   a shaft inserted into the housing;
   an annular sealing member sealing a gap by contacting a radial outer surface of the shaft or a radial outer surface of a rotary portion fixed to the shaft; and
   a lubricant groove storing a lubricant to be supplied between the annular sealing member and the radial outer surface, wherein
   the housing includes:
      a seal fixing spacer determining a size of the gap and further fixing the annular sealing member; and
      a lid portion fixing the seal fixing spacer,
   a radial inner side surface of the lid portion is located on a vertically higher side than a position of the annular sealing member,
   the lubricant groove is provided at the radial inner side surface of the lid portion,
   the shaft is supported in a linearly movable manner such that a relative position thereof to the housing is axially changed,
   a length from a first surface of the lid portion, the first surface being on a lower pressure side of the two spaces having different pressures, to the lubricant groove is equal to or more than a stroke corresponding to a maximum length allowed by linear movement of the shaft, and
   the lid portion includes: a second surface that faces a same direction as the first surface, that is different in level from the first surface in an axial direction of the shaft, and that is in contact with a frame body, an internal space of the frame body being on the lower pressure side of the two spaces having different pressures; and a cylindrical portion that has the first surface, that protrudes from the second surface, and that has a cylindrical shape around the shaft.

2. The sealing mechanism according to claim 1, wherein
   the radial inner side surface of the lid portion is located closer than a position of the annular sealing member to the lower pressure side of the two spaces having different pressures,
   the lubricant groove is provided at a part of the radial inner side surface of the lid portion, and
   a distance between the radial outer surface and a portion in the radial inner side surface of the lid portion, the portion in the radial inner side surface being located closer than the lubricant groove to the lower pressure side of the two spaces having different pressures is smaller than a size of the gap.

3. The sealing mechanism according to claim 1, wherein the shaft is supported in a rotatable manner.

4. The sealing mechanism according to claim 1, further comprising an electric motor applying at least one of rotary movement and linear movement to the shaft.

5. A conveyance device comprising:
   the sealing mechanism according to claim 1; and
   a movable member moving a conveyance object, wherein movement of the movable member is linked with at least one of rotary movement and linear movement of the shaft.

6. A manufacturing device comprising:
   the sealing mechanism according to claim 1;
   the frame body; and
   a moveable member moving a conveyance object existing in the internal space of the frame body, wherein
   the housing of the sealing mechanism covers an opening portion of the frame body from the outside of the frame body.

* * * * *